US008748874B2

(12) United States Patent
Yamada et al.

(10) Patent No.: US 8,748,874 B2
(45) Date of Patent: Jun. 10, 2014

(54) PROTEIN PHOTOELECTRIC CONVERSION DEVICE, PHOTOELECTRIC CONVERSION SYSTEM, PROTEIN PHOTOELECTRIC CONVERSION DEVICE MANUFACTURING METHOD, PHOTOELECTRIC CONVERSION SYSTEM MANUFACTURING METHOD AND PROTEIN-IMMOBILIZED ELECTRODE

(75) Inventors: Seiji Yamada, Kanagawa (JP); Yuichi Tokita, Kanagawa (JP); Yoshio Goto, Kanagawa (JP); Wei Luo, Kanagawa (JP); Satoshi Nakamaru, Kanagawa (JP)

(73) Assignee: Sony Corporation, Tokyo (JP)

( * ) Notice: Subject to any disclaimer, the term of this patent is extended or adjusted under 35 U.S.C. 154(b) by 221 days.

(21) Appl. No.: 13/339,064

(22) Filed: Dec. 28, 2011

(65) Prior Publication Data

US 2012/0181517 A1 Jul. 19, 2012

(30) Foreign Application Priority Data

Jan. 13, 2011 (JP) ................................ 2011-005055

(51) Int. Cl.
*H01L 51/46* (2006.01)

(52) U.S. Cl.
USPC ............... 257/40; 257/E51.026; 257/E51.045

(58) Field of Classification Search
USPC .......................................................... 257/40
See application file for complete search history.

(56) References Cited

U.S. PATENT DOCUMENTS

2008/0248354 A1* 10/2008 Kubo et al. ..................... 429/27
2009/0090905 A1* 4/2009 Tokita et al. ................... 257/40

2010/0264409 A1* 10/2010 Tokita et al. ................... 257/40
2011/0130550 A1* 6/2011 Hayashi et al. ............... 530/401

FOREIGN PATENT DOCUMENTS

JP     2007-220445    8/2007
JP     2010-190646    9/2010

OTHER PUBLICATIONS

Hamachi et al., "Electron Transfer from Zn-Protoporphyrin IX to Ruthenium Amine Attached to His63 of Reconstituted Cytochrome b562", Chemistry Letters, 1999, pp. 551-552.
Hay et al., "Protein engineering of cytochrome b562 for quinone binding and light-induced electron transfer", PNAS, Dec. 21, 2004, pp. 17675-17680, vol. 101, No. 51.
Itagaki et al., "Studies on Cytochrome b562 of *Escherichia coli*", The Journal of Biological Chemistry, May 10, 1967, vol. 242, No. 9, pp. 2272-2277.
Mathews et al., "The Structure of Cytochrome b562 from *Escherichia coli* at 2.5 A Resolution", The Journal of Biological Chemistry, Mar. 10, 1979, vol. 254, No. 5, pp. 1699-1706.
Mennega et al., "Effects of noncovalently bound quinones on the ground and triplet states of zinc chlorins in solution and bound to de novo synthesized peptides", Physical Chemistry Chemical Physics, 2006, vol. 8, pp. 5444-5453.
Nikkila et al., "Cloning and expression of the gene encoding the soluble chtochrome b562 of *Escherichia coli*", Eur. J. Biochem., 1991, vol. 202, pp. 309-313.
Shih et al., "Tryptophan-Accelerated Electron Flow Through Proteins", Science, Jun. 27, 2008, vol. 320, pp. 1760-1762.
Yasutomi et al., "A Molecular Photodiode System That Can Switch Photocurrent Direction", Science, Jun. 25, 2004, pp. 1944-1947.
Zuo et al., "Interfacial redox processes of cytochrome b562", Physical Chemistry Chemical Physics, 2009, vol. 11, pp. 7430-7436.

* cited by examiner

*Primary Examiner* — Thanh Nguyen
(74) *Attorney, Agent, or Firm* — K&L Gates LLP

(57) ABSTRACT

A protein photoelectric conversion device including a gold electrode; and a substance selected from the group consisting of a metal-substituted cytochrome $b_{562}$, a zinc chlorin cytochrome $b_{562}$, a derivative thereof, and a variant thereof immobilized on the gold electrode.

12 Claims, 39 Drawing Sheets theoretical pI:5.38
Mw(-heme):11780.23

HEME SIDE

BACK

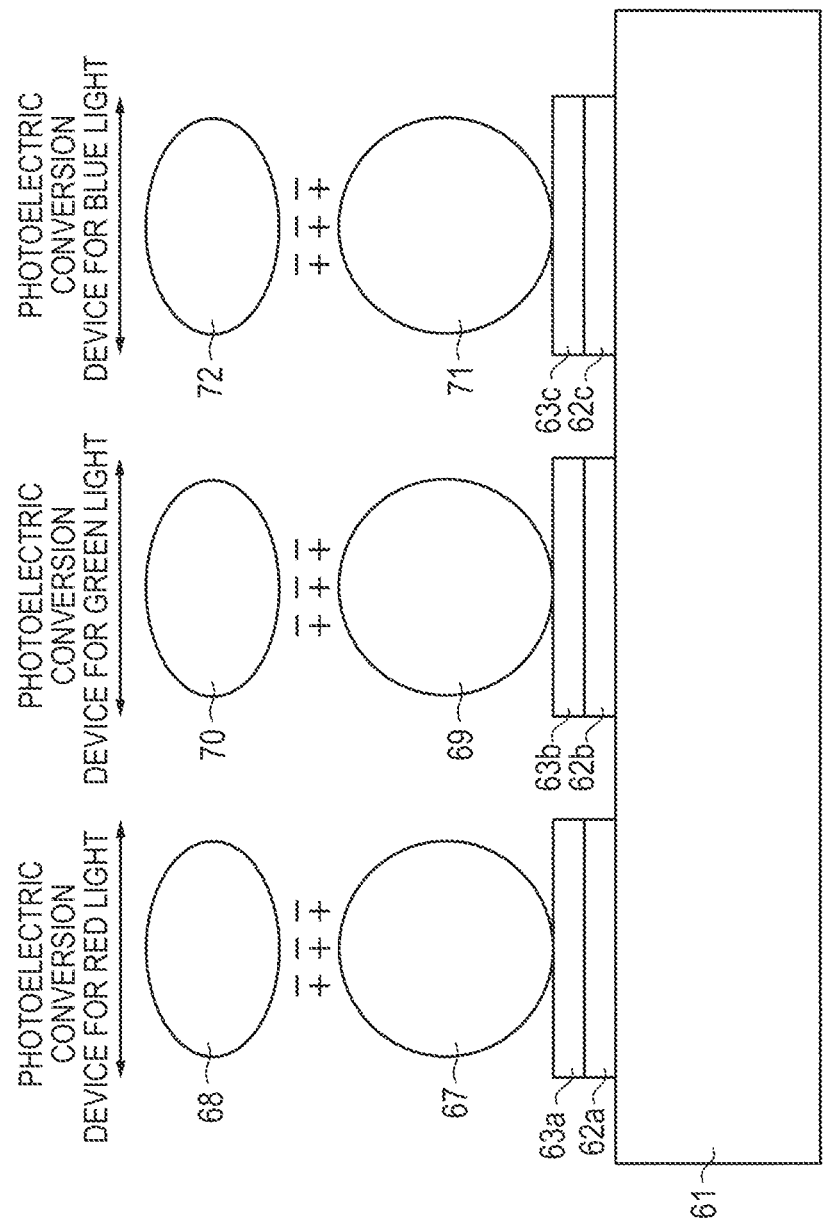

PROTEIN PHOTOELECTRIC CONVERSION DEVICE, PHOTOELECTRIC CONVERSION SYSTEM, PROTEIN PHOTOELECTRIC CONVERSION DEVICE MANUFACTURING METHOD, PHOTOELECTRIC CONVERSION SYSTEM MANUFACTURING METHOD AND PROTEIN-IMMOBILIZED ELECTRODE

CROSS REFERENCES TO RELATED APPLICATIONS

The present application claims priority to Japanese Patent Application No. 2011-005055 filed on Jan. 13, 2011, the disclosure of which is incorporated herein by reference.

BACKGROUND

The present disclosure relates to protein photoelectric conversion devices, photoelectric conversion systems, protein photoelectric conversion device manufacturing methods, photoelectric conversion system manufacturing methods, and protein-immobilized electrodes. More specifically, the present disclosure relates to use of a protein with a cytochrome $b_{562}$ base in protein photoelectric conversion devices, photoelectric conversion systems, protein photoelectric conversion device manufacturing methods, photoelectric conversion system manufacturing methods, and protein-immobilized electrodes.

Protein is expected to become the next generation functional device that replaces the semiconductor devices. While the semiconductor devices can only be miniaturized to as small as several ten nanometers, protein can exhibit highly sophisticated, complex functions in much smaller sizes of 2 to 10 nm.

There has been proposed a photoelectric conversion device that uses a protein, specifically a photoelectric conversion device that uses a protein-immobilized electrode of a structure in which a zinc-substituted cytochrome c obtained by substituting the central metal iron of the heme in the horse myocardial cytochrome c with zinc is immobilized on a gold electrode. The protein-immobilized electrode is described as being capable of producing a photocurrent (see JP-A-2007-220445). As another example of a photoelectric conversion device that uses a protein, a device is proposed that uses a protein-immobilized electrode of a structure in which a zinc-substituted cytochrome c552 is immobilized on a gold electrode (see JP-A-2010-190646).

There are reports concerning cytochrome $b_{562}$, including an expression and purification method using *Escherichia coli* (see Nikkila, H., Gennis, R. B., and Sliger, S. G. Eur. J. Biochem. 202,309 (1991)), conformation (256B. pdb, see Mathews, F. S., Bethge, P. H., and Czerwinski, E. W. J. Biol. Chem. 254,1699 (1979)), a method for extracting a heme (see Itagaki, E., Palmer, G. and Hager, L. P. J. Biol. Chem. 242, 2272 (1967)), a method for incorporating zinc porphyrin (see Hamachi, I., Takashima, H., Tsukiji, S. Shinkai, S., Nagamune, T. and Oishi, S. Chem. Lett. 1999, 551 (1999)), a method for incorporating a quinone into a molecule (see Hay, S., Wallace, B. B., Smith, T. A., Ghiggino, K. P. and Wydrzynski, T. Proc. Natl. Sci USA, 101, 17675 (2004)), and an immobilization method for a silver electrode (see Zuo, P., Albrecht, T. Baker, P. D., Murgida, D. H., and Hildebrandt, P. Phys. Chem. Chem. Phys. 11,7430 (2009)). There are also proposed a photoelectric conversion device for blue light that uses a zinc-substituted cytochrome c552, and a photoelectric conversion device for red light or green light that uses a modified zinc porphyrin cytochrome c552 (see JP-A-2010-190646).

SUMMARY

However, in the horse myocardial cytochrome c used in the preparation of the zinc-substituted cytochrome c in the photoelectric conversion device proposed in JP-A-2007-220445, the prosthetic group porphyrin is covalently bonded to the cysteine residue. This makes it difficult to detach the porphyrin from the horse myocardial cytochrome c, and it is only possible to replace the central iron with zinc or tin. This has severely limited the type of usable protein.

Accordingly, there is a need for a protein photoelectric conversion device and a manufacturing method thereof that use a variety of proteins, including a metal-substituted cytochrome $b_{562}$ prepared by using an *Escherichia coli*-derived cytochrome $b_{562}$ as the base.

There is also a need for a photoelectric conversion system and a manufacturing method thereof that use a protein photoelectric conversion device that uses a variety of proteins, including a metal-substituted cytochrome $b_{562}$ prepared by using an *Escherichia coli*-derived cytochrome $b_{562}$ as the base.

Further, there is a need for a protein-immobilized electrode and a manufacturing method thereof in which a variety of proteins, including an *Escherichia coli*-derived cytochrome $b_{562}$ and a metal-substituted cytochrome $b_{562}$ prepared by using this cytochrome $b_{562}$ as the base, are immobilized.

The present inventors conducted intensive studies to solve the foregoing problems of the related art, and found that a protein that uses an *Escherichia coli*-derived cytochrome $b_{562}$ as the base could be effectively used as the protein for the protein photoelectric conversion device. The cytochrome $b_{562}$ allows the heme or porphyrin to be easily added or removed, and can easily accommodate multiple colors through replacement of the central metal or modification of the porphyrin. It was also found that the cytochrome $b_{562}$ or a protein using the cytochrome $b_{562}$ as the base could be easily immobilized on a gold electrode. Another finding is that introducing a redox active group with π electrons into the molecule of the protein that uses the cytochrome $b_{562}$ as the base can amplify the photocurrent.

The present disclosure has been completed through the diligent studies conducted by the present inventors, based on the foregoing findings independently obtained by the present inventors.

An embodiment of the present disclosure is directed to a protein photoelectric conversion device that includes a gold electrode; and a metal-substituted cytochrome $b_{562}$ or a zinc chlorin cytochrome $b_{562}$, or a derivative or a variant thereof immobilized on the gold electrode.

Another embodiment of the present disclosure is directed to a photoelectric conversion system that includes a protein photoelectric conversion device that includes a gold electrode; and a metal-substituted cytochrome $b_{562}$ or a zinc chlorin cytochrome $b_{562}$, or a derivative or a variant thereof immobilized on the gold electrode.

Yet another embodiment of the present disclosure is directed to a method for manufacturing a protein photoelectric conversion device, the method including immobilizing a metal-substituted cytochrome $b_{562}$ or a zinc chlorin cytochrome $b_{562}$, or a derivative or a variant thereof on a gold electrode.

Still another embodiment of the present disclosure is directed to a method for manufacturing a photoelectric conversion system, the method including immobilizing a metal-substituted cytochrome $b_{562}$ or a zinc chlorin cytochrome $b_{562}$, or a derivative or a variant thereof on a gold electrode.

Still yet another embodiment of the present disclosure is directed to a protein-immobilized electrode that includes a gold electrode; and a cytochrome $b_{562}$, a metal-substituted cytochrome $b_{562}$, a zinc chlorin cytochrome $b_{562}$, or a derivative or a variant thereof immobilized on the gold electrode.

Preferably, the metal-substituted cytochrome $b_{562}$ or the zinc chlorin cytochrome $b_{562}$, or the derivative or the variant thereof, or the cytochrome $b_{562}$ or the derivative or the variant thereof is immobilized in such an orientation that the porphyrin propionic acid contained therein faces the gold electrode. A redox active group with H electrons is introduced to the metal-substituted cytochrome $b_{562}$ or the zinc chlorin cytochrome $b_{562}$, or the derivative or the variant thereof, as required. Known redox active groups may be used and selected according to needs. Preferably, tryptophan or quinone is used as the redox active group. The metal of the metal-substituted cytochrome $b_{562}$ is appropriately selected so as to obtain a desired photoelectric conversion wavelength. Examples include zinc (Zn), beryllium (Be), strontium (Sr), niobium (Nb), barium (Ba), lutetium (Lu), hafnium (Hf), tantalum (Ta), cadmium (Cd), antimony (Sb), thorium (Th), and lead (Pb). The derivatives of the cytochrome $b_{562}$, metal-substituted cytochrome $b_{562}$, or zinc chlorin cytochrome $b_{562}$ are compounds in which the backbone amino acid residue or porphyrin is chemically modified. The variants of the cytochrome $b_{562}$, metal-substituted cytochrome $b_{562}$, or zinc chlorin cytochrome $b_{562}$ are compounds in which some of the backbone amino acid residues are substituted with other amino acid residues.

The photoelectric conversion system typically includes two or more photoelectric conversion devices that respond to light of different wavelengths. At least one of the photoelectric conversion devices is the protein photoelectric conversion device that includes the gold electrode and the metal-substituted cytochrome $b_{562}$, zinc chlorin cytochrome $b_{562}$, or a derivative or a variant thereof immobilized on the gold electrode. The number of photoelectric conversion devices in the photoelectric conversion system is appropriately selected according to factors such as the intended use of the photoelectric conversion system. The photoelectric conversion system is, for example, a color imaging device, or an optical sensor.

The protein photoelectric conversion device may include a counter electrode, in addition to the protein-immobilized electrode in which the metal-substituted cytochrome $b_{562}$, zinc chlorin cytochrome $b_{562}$, or a derivative or a variant thereof is immobilized on the gold electrode. The counter electrode is provided opposite the protein-immobilized electrode with a gap in between.

In accordance with the embodiments of the present disclosure configured as above, the transfer of the heme or porphyrin in and out of the *Escherichia coli*-derived cytochrome $b_{562}$ can be performed more easily than in the cytochrome c. Thus, by using the cytochrome $b_{562}$ as the base, various proteins such as the metal-substituted cytochrome $b_{562}$ and zinc chlorin cytochrome $b_{562}$ can be easily prepared. Further, by using the metal-substituted cytochrome $b_{562}$, zinc chlorin cytochrome $b_{562}$, or a derivative or a variant thereof for the protein photoelectric conversion device, the photoelectric conversion device can absorb visible light of various wavelengths.

The embodiments of the present disclosure can realize, for example, a protein photoelectric conversion device that uses various proteins such as the metal-substituted cytochrome $b_{562}$ prepared from cytochrome $b_{562}$ used as the base, and a variety of photoelectric conversion systems that use the protein photoelectric conversion device. The superior color imaging device, optical sensor, or photoelectric conversion device produced with these devices or systems can then be used to realize superior electronic devices.

Additional features and advantages are described herein, and will be apparent from the following Detailed Description and the figures.

BRIEF DESCRIPTION OF THE FIGURES

FIG. 39 is a schematic diagram representing a second example of the color imaging device according to Fourth Embodiment of the present disclosure.

DETAILED DESCRIPTION

Embodiments of the present application will be described below in detail with reference to the drawings.

The following will describe modes for carrying out the present disclosure (hereinafter, "embodiments"). Descriptions will be given in the following order.

1. First Embodiment (Protein-immobilized electrode and manufacturing method thereof)
2. Second Embodiment (Protein photoelectric conversion device)
3. Third Embodiment (Liquid contactless whole solid-type protein photoelectric conversion device)
4. Fourth Embodiment (Color imaging device)

1. First Embodiment

Protein-Immobilized Electrode

Figure 1:
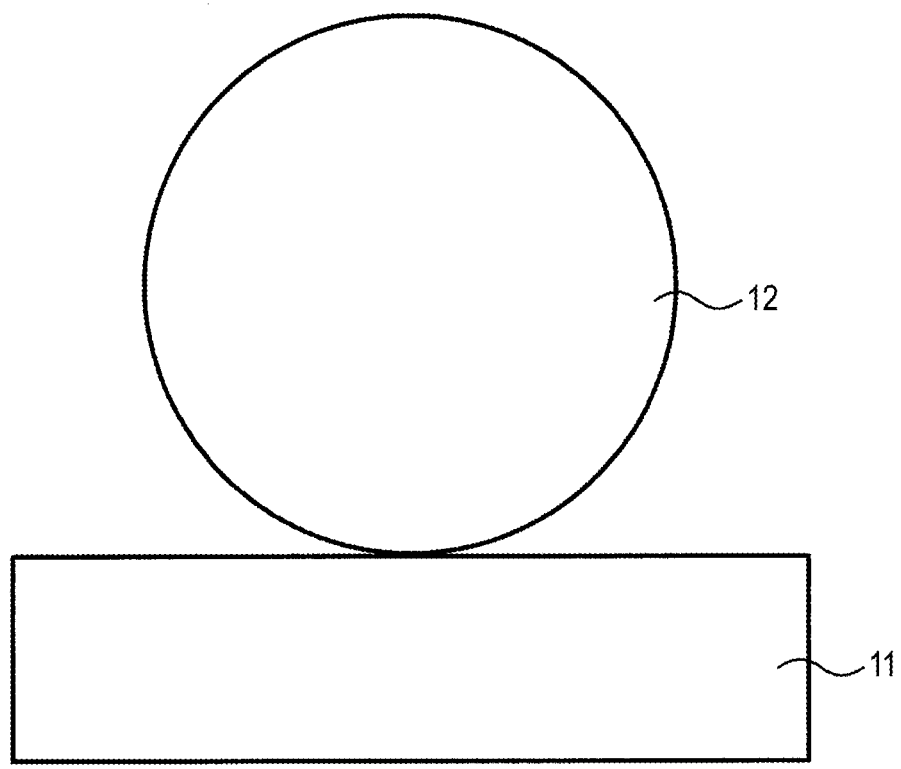
FIG. 1 is a schematic diagram illustrating a protein-immobilized electrode according to First Embodiment of the present disclosure.

FIG. 1 illustrates a protein-immobilized electrode according to First Embodiment.

As illustrated in FIG. 1, the protein-immobilized electrode includes a gold electrode 11, and a protein 12 immobilized thereon. The protein 12 is of an *Escherichia coli*-derived cytochrome $b_{562}$, a metal-substituted cytochrome $b_{562}$, a zinc chlorin cytochrome $b_{562}$, or a derivative or a variant thereof.

Though the protein 12 illustrated in FIG. 1 is a single molecule, the number of proteins 12 immobilized on the gold electrode 11 is decided according to needs. Generally, a plurality of proteins 12 is immobilized as a monomolecular film or a multimolecular film. Further, despite that the gold electrode 11 illustrated in FIG. 1 has a flat surface, the gold electrode 11 may have any surface shape, including, for example, a depressed surface, a raised surface, and an irregular surface. The protein 12 can easily be immobilized regardless of the surface shape. Further, the gold electrode 11 may have any shape as a whole, including, for example, a plate shape and a drop shape.

Preferably, the protein 12 is immobilized in such a manner that the heme or the porphyrin propionic acid is on the side of the gold electrode 11. Because the heme or porphyrin propionic acid site of the protein 12 has a large negative charge, the protein 12 can be adsorbed on the gold electrode 11 by electrostatic attraction force when the surface of the gold electrode 11 is positively charged. The surface of the gold electrode 11 can be positively charged using various known methods, which may be selected according to needs. For example, a method can be used that forms a self-assembled monolayer (SAM) in a manner allowing a positive charge to develop on the outermost surface of the gold electrode 11.

Protein-Immobilized Electrode Manufacturing Method

The protein-immobilized electrode can be manufactured, for example, by positively charging the surface of the gold electrode 11, and dipping the gold electrode 11 in a protein 12-dissolved buffer to adsorb the protein 12 on the surface of the gold electrode 11.

Example 1 a. *Escherichia coli*-Derived Cytochrome $b_{562}$ Expression and Purification Method A plasmid (Cyt-$b_{562}$/pKK223-3) that has incorporated the structural gene of *Escherichia coli*-derived cytochrome $b_{562}$ was produced, and transformed into the *Escherichia coli* JM109 strain. Expression and purification followed the method described in Nikkila, H., Gennis, R. B., and Sliger, S. G. Eur. J. Biochem. 202, 309 (1991).

A preculture cultured overnight in LB-Amp medium (100 mL) at 37° C. was transferred to Terrific broth 4 L (2 L×2), and cultured at 37° C. for 5 to 6 hours. The cells were further cultured at 25° C. for 18 hours after adding 0.2 mM IPTG. As a result, bacteria (70 g), red in color, were obtained. The bacteria were frozen, and suspended in 10 mM Tris-HCl (pH 8.0, 200 mL) that contained 1 mM EDTA, 1 mM PMSF, 0.2 mg/mL lysozyme, DTT (as appropriate), and DNase (as appropriate). The cells were then disrupted by ultrasonic wave.

2 M phosphoric acid was added to the supernatant after centrifugation to adjust the pH to 4.55, and unnecessary proteins were precipitated by centrifugation. The resulting sample was purified by CM52 anion-exchange column chromatography (column volume 80 mL, 50 to 150 mM KCl linear gradient/50 mM potassium phosphate (pH 4.55)), and by Sephadex G50 Finegel filtration chromatography (column volume 480 mL, 50 mM Tris-HCl, 0.1 mM EDTA, pH 8.0). As a result, an about 80 mg of cytochrome $b_{562}$ was obtained.

Figure 2:
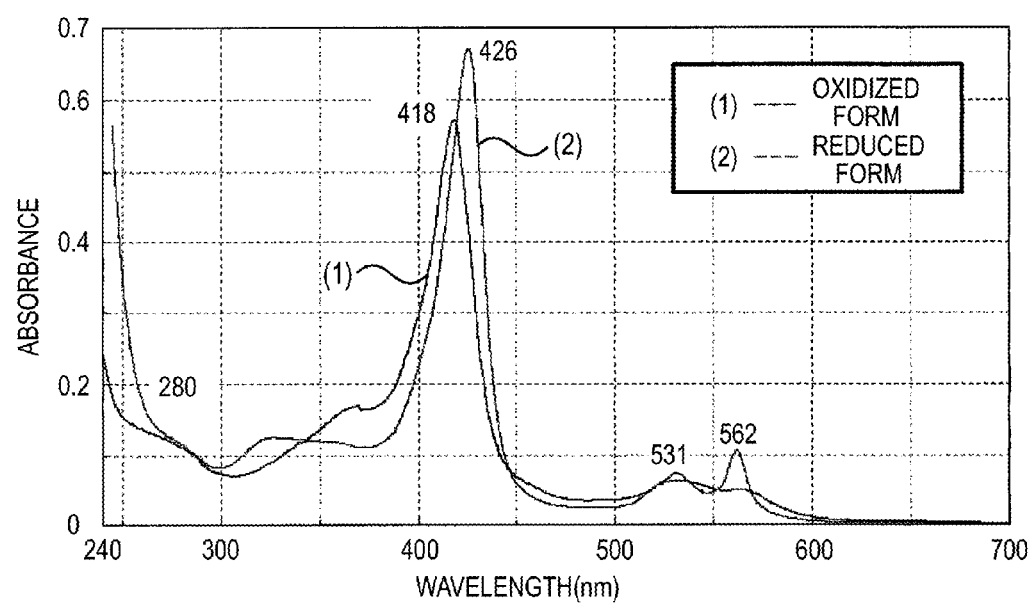
FIG. 2 is a schematic diagram representing the absorption spectra of the purified cytochrome $b_{562}$.

FIG. 2 represents the absorption spectra of the purified cytochrome $b_{562}$. Measurements were performed for the purified cytochrome $b_{562}$ dipped in a 10 mM sodium phosphate (pH 7.0) buffer. As represented in FIG. 2, the cytochrome $b_{562}$ in the purified state was in an oxidized form with absorption peaks at 418 nm and 532 nm. In the reduced form obtained by adding a small amount of dithionite to the buffer, absorption peaks were confirmed at 426 nm, 531 nm, and 562 nm.

The cytochrome $b_{562}$ had the amino acid sequence below. In this amino acid sequence, the ligand methionine 7 and histidine 102 of the heme (underlined), and isoleucine 17 have important roles, as will be described later.

```
ADLEDNMETL NDNLKVIEKA DNAAQVKDAL TKMRAAALDA

QKATPPKLED KSPDSPEMKD FRHGFDILVG QIDDALKLAN

EGKVKEAQAA AEQLKTTRNA YHQKYR
``` b. Immobilization of Cytochrome $b_{562}$ on Gold Drop Electrode

Figure 3A:
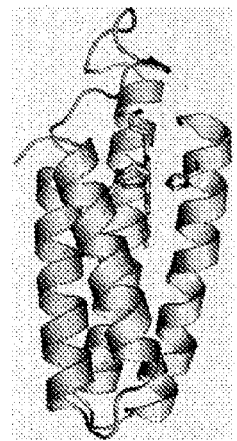
FIGS. 3A to 3C are schematic diagrams illustrating the structure of cytochrome $b_{562}$.
Figure 3B:
Figure 3C:
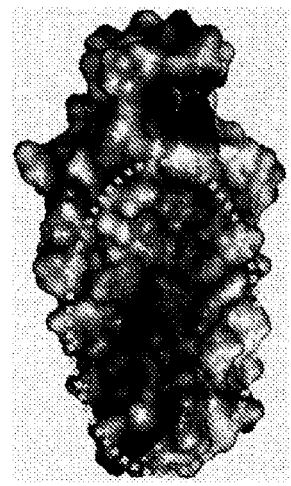
Figure 4:
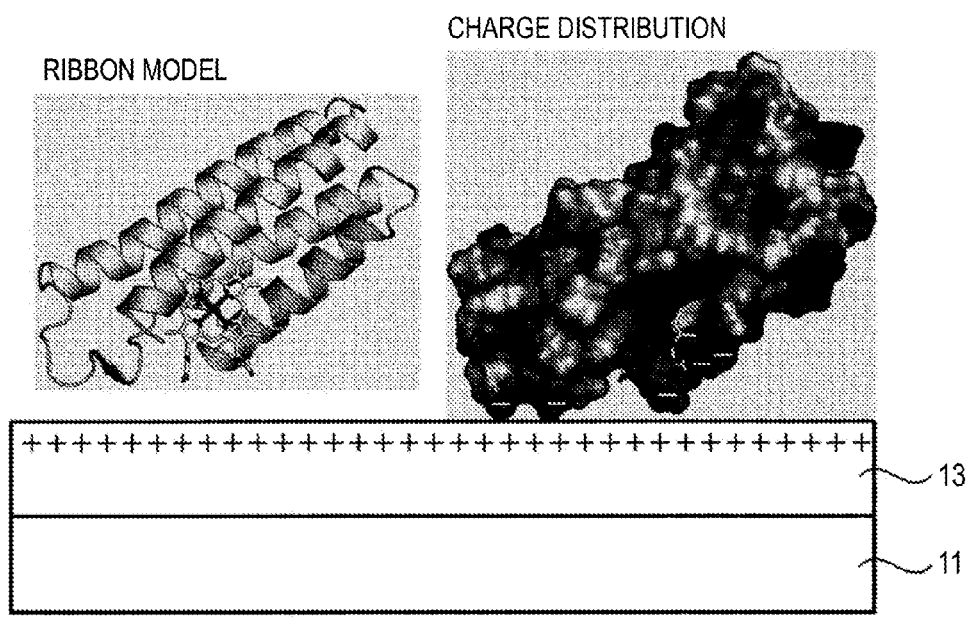
FIG. 4 is a schematic diagram representing how the cytochrome $b_{562}$ is adsorbed on a gold electrode via a self-assembled monolayer.

FIGS. 3A, 3B, and 3C represent the cytochrome $b_{562}$ crystalline structure determined in 1979 by X-ray crystalline structure analysis (see Mathews, F. S., Bethge, P. H., and Czerwinski, E. W. J. Biol. Chem. 254, 1699 (1979)). FIG. 3A represents a ribbon model, with the heme and the ligand amino acids shown in a rod model. FIG. 3B represents the charge distribution of the cytochrome $b_{562}$ oriented as in FIG. 3A. The elliptic area circled by broken line is the heme-propionic acid exposed surface with the strongest negative charge (also in FIG. 3C). FIG. 3C represents the charge distribution of the cytochrome $b_{562}$ rotated 180° about the vertical axis from the state shown in FIG. 3B (the back of the cytochrome $b_{562}$ shown in FIG. 3B). As represented in FIGS. 3A, 3B, and 3C, the cytochrome $b_{562}$ has a 4-helix bundle structure with one prosthetic heme molecule. The heme propionic acid is exposed by sticking out from the molecule. In the charge distribution of FIG. 3B, it can be seen that a strong negative charge occurs at the propionic acid site of the heme. The cytochrome $b_{562}$ can thus be adsorbed on the gold electrode 11 at the propionic acid site of the heme, when the surface of the gold electrode 11 is positively charged. FIG. 4 schematizes this state (only the heme is shown in a rod model). In this example, a self-assembled monolayer 13 with a positive charge on the outermost surface is formed on the gold electrode 11, and the cytochrome $b_{562}$ is adsorbed on the self-assembled monolayer 13 by the electrostatic attraction force that acts between the positively charged outermost surface of the self-assembled monolayer 13 and the negatively charged heme propionic acid site of the cytochrome $b_{562}$.

A gold drop electrode with a diameter of 2 mm was formed as the gold electrode 11.

The gold drop electrode was washed with hot concentrated sulfuric acid (120° C.), and the surface of the gold drop electrode was roughened (more irregularity was formed) by a redox cycle treatment in the sulfuric acid. The gold drop electrode was immersed in a 0.1 mM 11-aminoundecanethiol ($H_2N$—$C_{11}$—SH)/ethanol solution at room temperature for at least 16 hours to form a $H_2N$—$C_{11}$—SH film as the self-assembled monolayer 13 on the surface of the gold drop electrode. The gold drop electrode with the $H_2N$—$C_{11}$—SH film was dried with compressed air, and incubated at 4° C. day and night after being soaked in a 50 μM cytochrome $b_{562}$/4.4 mM potassium phosphate (pH 7.2) solution (60 μL).

Figure 5:
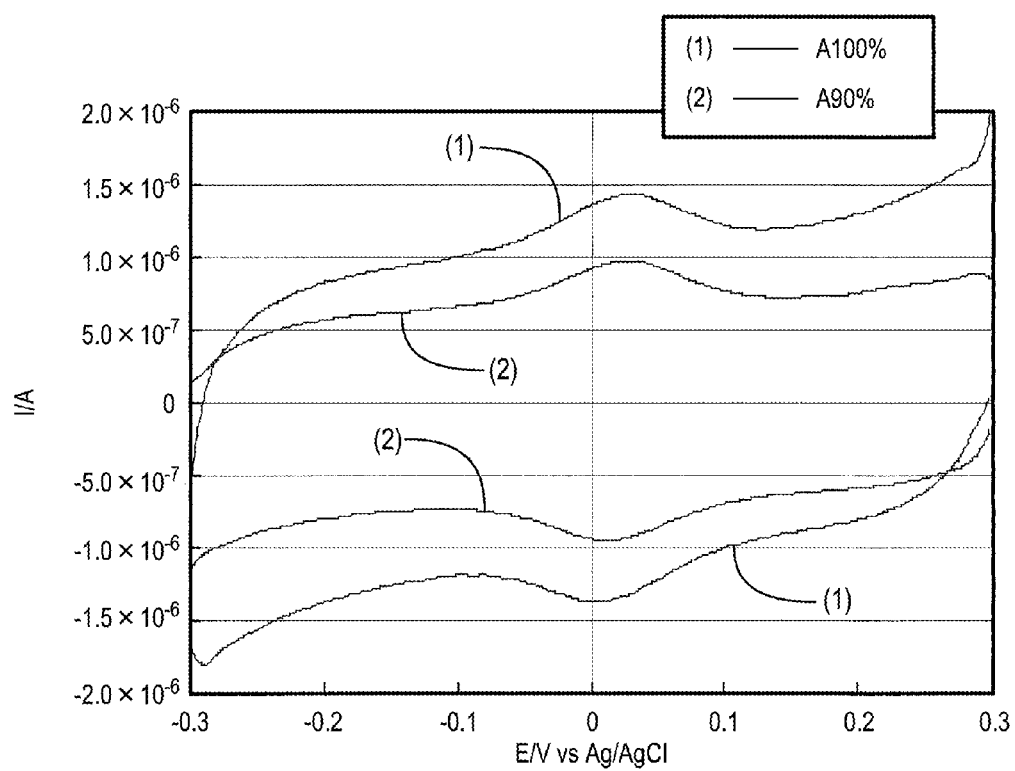
FIG. 5 is a schematic diagram representing a cyclic voltammogram obtained with a cytochrome $b_{562}$-immobilized gold drop electrode.

FIG. 5 represents a cyclic voltammogram of the incubated gold drop electrode measured by being dipped in 10 mM sodium phosphate (pH 7.0). The potential sweep rate was 1 V/s. As represented in FIG. 5, an adsorption cyclic voltammogram was obtained. The cytochrome $b_{562}$ on the gold drop electrode surface had an effective surface area of 1.7±0.6 pmol/cm$^2$. The redox potential was −4±11 mV vs Ag/AgCl, and the electron transfer rate constant between the cytochrome $b_{562}$ and the gold drop electrode was 90±12 s$^{-1}$. The same adsorption effect was also obtained when 0 to 10% hydroxyundecanethiol was mixed in the 11-aminoundecanethiol formed on the surface of the gold drop electrode. FIG. 5 also represents a cyclic voltammogram of the mixture of 11-aminoundecanethiol and 10% hydroxyundecanethiol.

Example 2 a. Preparation of Zinc-Substituted Cytochrome $b_{562}$

A method for preparing zinc-substituted cytochrome $b_{562}$ is reported in Hamachi et al. (Hamachi, I., Takashima, H., Tsukiji, S. Shinkai, S., Nagamune, T. and Oishi, S. Chem. Lett. 1999, 551 (1999)), and accordingly the zinc-substituted cytochrome $b_{562}$ was prepared according to the method described in this publication.

First, 1 M hydrochloric acid was added to 3 mL of a cytochrome $b_{562}$ aqueous solution (33 μM) to adjust the pH at 2 to 3. Then, 3 mL of water-cooled 2-butanone was added to the cytochrome $b_{562}$ aqueous solution, and the mixture was gently stirred to extract the heme from the cytochrome $b_{562}$. The butanone layer was removed by pipetting. This extraction procedure was repeated until the butanone layer did not impart any color. A minute amount of 1 M Tris-HCl (pH 8.0) was then added to the aqueous solution after the repeated heme extraction procedure to adjust the pH at 7 to 8, and the solution was dialyzed against ultrapure water (2 L×5 times) to obtain apocytochrome $b_{562}$.

Zinc protoporphyrin IX (ZnPP) was dissolved in dimethylsulfoxide, and added in 2 equivalents to the apocytochrome $b_{562}$ solution. The protein fraction was collected using a Bio-gel P10 desalting column equilibrated with 50 mM Tris-HCl (pH 8.0) and 0.1 mM EDTA, and a purified zinc-substituted cytochrome $b_{562}$ (Zn-Cyt $b_{562}$) was obtained.

Figure 6:
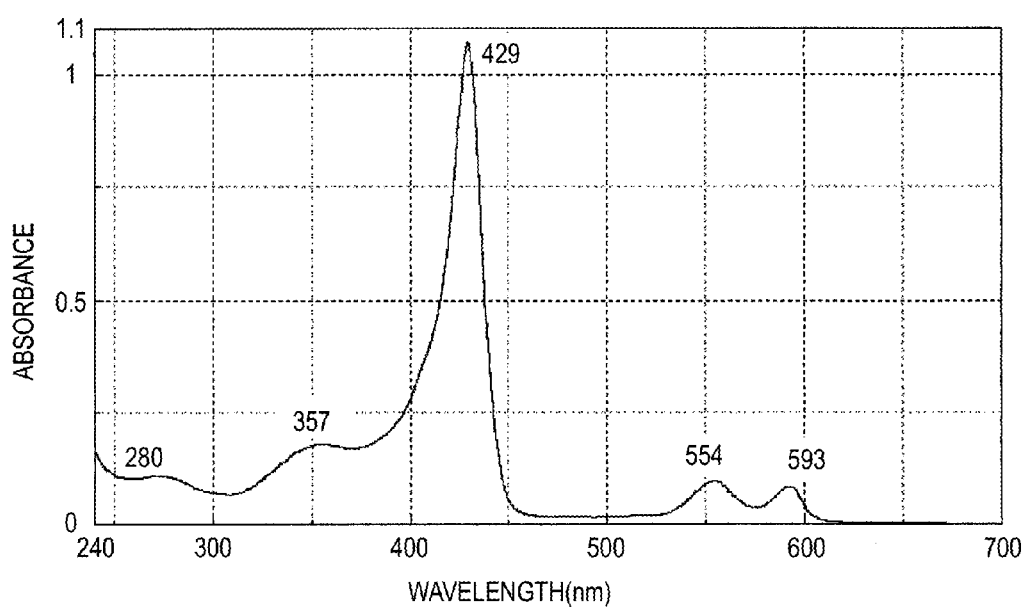
FIG. 6 is a schematic diagram representing the absorption spectrum of zinc-substituted cytochrome $b_{562}$.

FIG. 6 represents the absorption spectrum of the zinc-substituted cytochrome $b_{562}$. Measurements were performed for the zinc-substituted cytochrome $b_{562}$ dipped in a 10 mM sodium phosphate (pH 7.0) buffer. As represented in FIG. 6, absorption peaks occurred at 280 nm, 357 nm, 429 nm, 554 nm, and 593 nm, a match with the positions reported in Hamachi et al. The ratio of the absorbance at 429 nm wavelength to the absorbance at 554 nm wavelength (A429/A554) was 11.05.

b. Immobilization of Zinc-Substituted Cytochrome $b_{562}$ on Gold Drop Electrode and Photocurrent Measurement A gold drop electrode with a diameter of 2 mm was formed as the gold electrode 11.

The gold drop electrode was washed with hot concentrated sulfuric acid (120° C.), and the surface of the gold drop electrode was roughened (more irregularity was formed) by a redox cycle treatment in the sulfuric acid. The gold drop electrode was immersed in a 0.1 mM 11-aminoundecanethiol ($H_2N$—$C_{11}$—SH)/ethanol solution at room temperature for at least 16 hours to form a $H_2N$—$C_{11}$—SH film as the self-assembled monolayer 13 on the gold drop electrode surface. The gold drop electrode with the $H_2N$—$C_{11}$—SH film was dried with compressed air, and incubated at 4° C. day and night after being soaked in a 50 µM zinc-substituted cytochrome $b_{562}$/4.4 mM potassium phosphate (pH 7.2) solution (60 µL).

Photocurrent was measured in 10 mM sodium phosphate (pH 7.0) purged with nitrogen, using Ag/AgCl as the reference electrode, and a Pt mesh electrode as the counter electrode.

Figure 7:
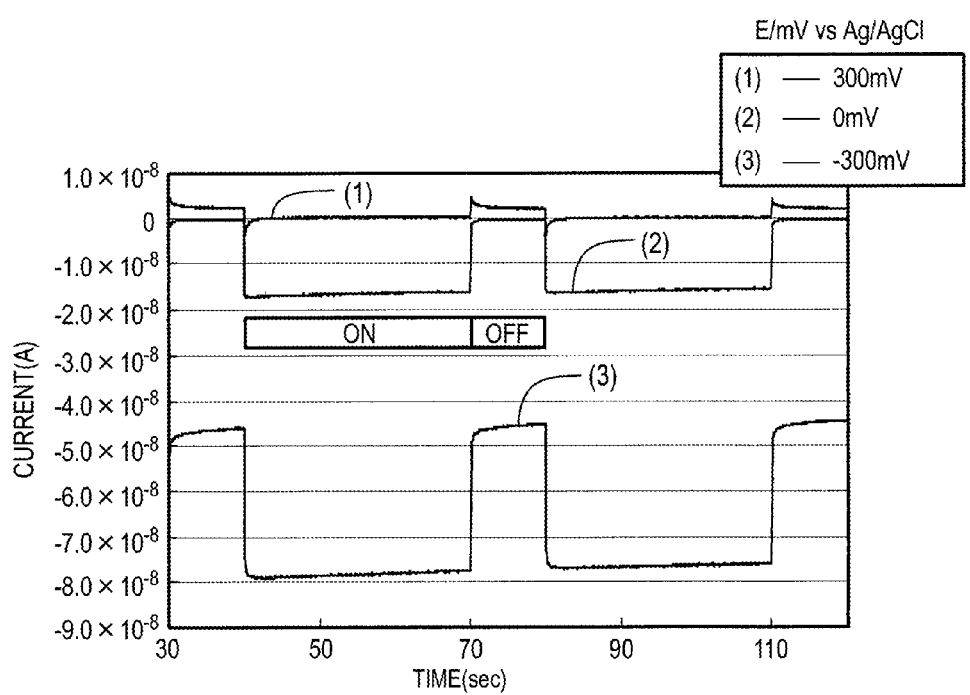
FIG. 7 is a schematic diagram representing the photocurrent real-time waveforms obtained with a zinc-substituted cytochrome $b_{562}$-immobilized gold drop electrode.
Figure 8:
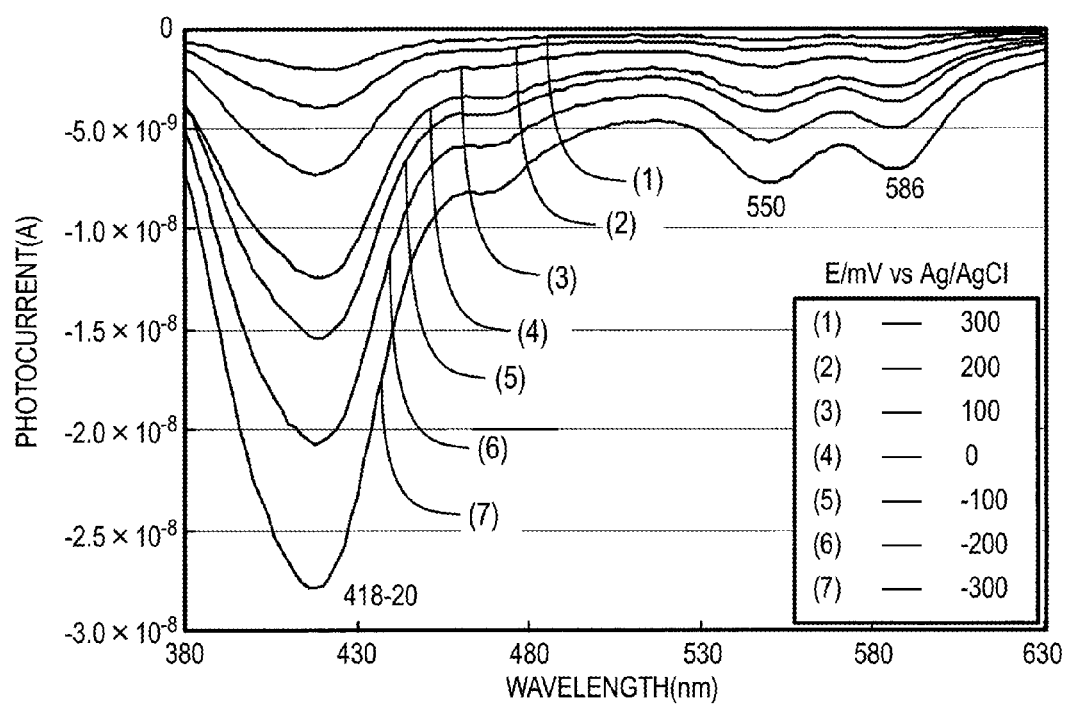
FIG. 8 is a schematic diagram representing the photocurrent action spectra obtained with a zinc-substituted cytochrome $b_{562}$-immobilized gold drop electrode.
Figure 9:
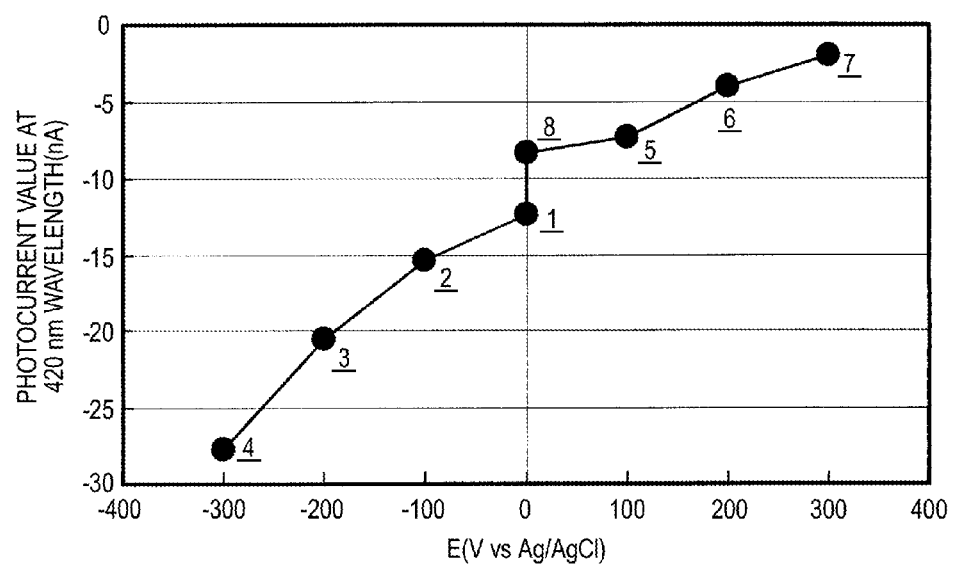
FIG. 9 is a schematic diagram representing the current-voltage curve obtained with a zinc-substituted cytochrome $b_{562}$-immobilized gold drop electrode.

FIG. 7 represents the measured photocurrents (photocurrent real-time waveforms) at the bias voltages of 300 mV, 0 mV, and −300 mV. In FIG. 7, the current value is plotted against time in 30 seconds of irradiation with the light of 420 nm wavelength followed by a 10-second off period. As shown in FIG. 7, the photocurrents observed in this bias voltage range were all cathodic. FIG. 8 represents photocurrent action spectra. As represented in FIG. 8, peak current wavelengths were 418 to 420 nm, 550 nm, and 586 nm, greatly different from the absorption maximum wavelengths 429 nm, 554 nm, and 593 nm in the zinc-substituted cytochrome $b_{562}$ solution ultraviolet-visible absorption spectrum represented in FIG. 6. The ratio of the photocurrent at 418 to 420 nm wavelength to the photocurrent at 550 nm wavelength was 3.7, a value much smaller than the photocurrent ratio 11.05 in the absorption spectrum of FIG. 6. FIG. 9 represents the photocurrent values at 420 nm wavelength plotted against potential E. In FIG. 9, the numbers on the current-voltage curve represent the order in which the data were acquired. According to JP-A-2007-220445, a threshold occurs near −100 mV (vs Ag/AgCl) for the zinc-substituted cytochrome c immobilized on a gold electrode, and the inversion of the photocurrent occurs at this potential. However, this is not seen in the zinc-substituted cytochrome $b_{562}$ represented in FIG. 9. Further, unlike in JP-A-2007-220445, adding potassium ferrocyanide does not enhance the photocurrent.

Example 3 a. Preparation of Zinc Chlorin Cytochrome $b_{562}$

Apocytochrome $b_{562}$ was obtained in the same manner as in Example 2.

Figure 10:
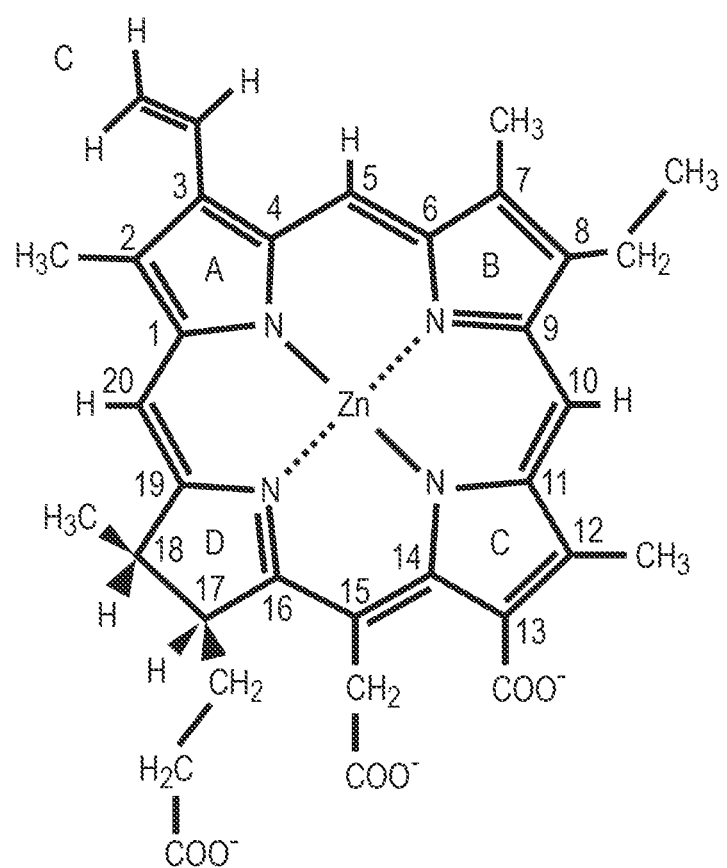
FIG. 10 is a schematic diagram representing the structure of zinc chlorin.

Zinc chlorin (ZnCe6, FIG. 10) was synthesized according to Mennenga, A., Gartner, W., Lubitz, W. and Gorner, H. Phys. Chem. Chem. Phys. 8, 5444 (2006). A mixture of 25 mM glycine and 50 mM NaCl (pH 10; hereinafter "buffer A") was used as the compound-dissolving buffer. A mixture of 10 mM chlorin e6 (50 µL), buffer A (45 µL), and 100 mM anhydrous zinc acetate (5 µL) was prepared, and incubated in ice for at least 30 min (500 nmol in terms of ZnCe6). The dark green solution turned bright green in color.

Figure 11:
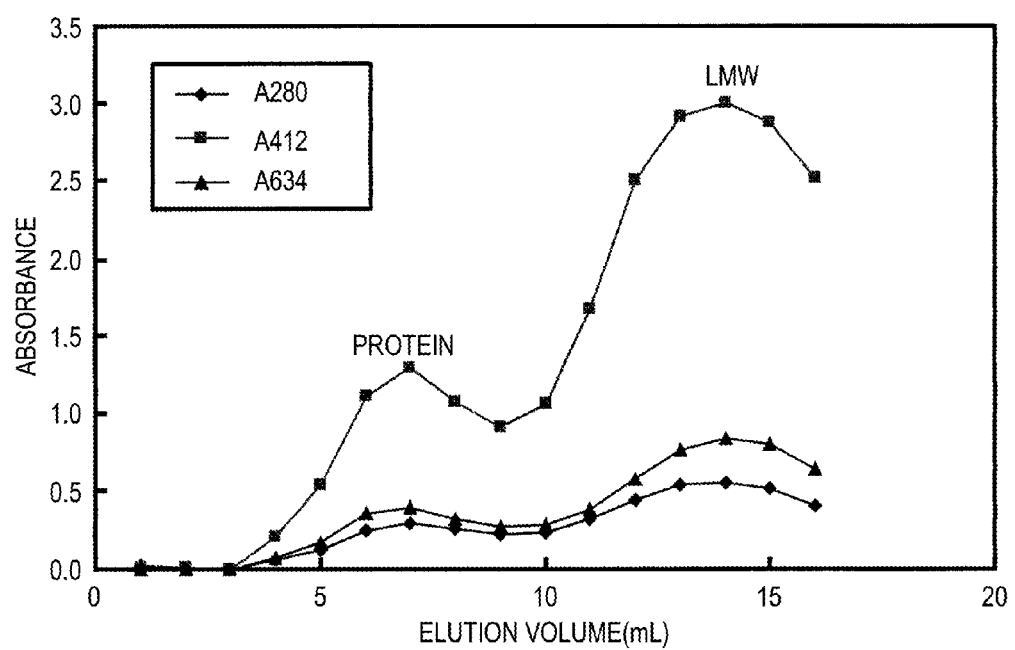
FIG. 11 is a schematic diagram representing the column elution patterns of zinc chlorin cytochrome $b_{562}$.

Then, an equal amount of 55.6 µM apocytochrome $b_{562}$ was added to the solution (apocytochrome $b_{562}$: 5.1 nmol), and the mixture was incubated in ice for at least 30 min. The mixture was then loaded into an Econo-Pac 10DG desalting column (Biorad), and eluted with 50 mM KPi and 100 mM KCl at pH 7.2. 50 mM KPi and 100 mM KCl, pH 7.2 were used as the buffer. The fraction was collected in 1-mL portions, and absorbance was measured at 280 nm, 412 nm, and 634 nm wavelengths. FIG. 11 represents the elution patterns. As shown in FIG. 11, two separate bands were observed in the bottom curve. Pigment absorption also occurred in the first protein fraction (elution volume of 4 to 8 mL). Elution volumes of 10 mL and higher are due to the pigment.

Pigment absorption does not occur in the protein fraction in the absence of zinc. Specifically, the coordinate bond between zinc and cytochrome $b_{562}$ is important for the incorporation of the pigment. This tendency is also observed in the preparation of zinc biliverdin $b_{562}$.

Figure 12:
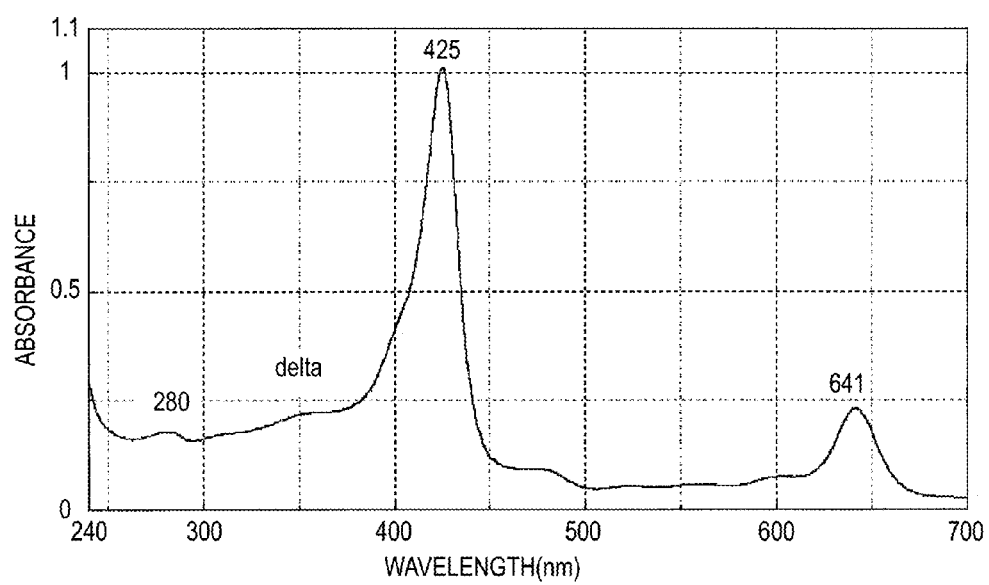
FIG. 12 is a schematic diagram representing the absorption spectrum of zinc chlorin cytochrome $b_{562}$.

FIG. 12 represents the absorption spectrum of the purified zinc chlorin cytochrome $b_{562}$. Measurements were made for the zinc chlorin cytochrome $b_{562}$ dipped in a 10 mM NaPi (pH 7.0) buffer. As shown in FIG. 12, absorption peaks occur at 425 nm and 641 nm wavelengths.

b. Immobilization of Zinc Chlorin Cytochrome $b_{562}$ on Gold Drop Electrode and Photocurrent Measurement A gold drop electrode with a diameter of 2 mm was formed as the gold electrode 11.

The gold drop electrode was washed with hot concentrated sulfuric acid (120° C.), and the surface of the gold drop electrode was roughened (more irregularity was formed) by a redox cycle treatment in the sulfuric acid. The gold drop electrode was immersed in a 0.1 mM 11-aminoundecanethiolhydrochloride/ethanol solution, and incubated at room temperature for at least 16 hours. The gold drop electrode was then rinsed with ethanol, and incubated at 4° C. day and night by being immersed in a 50 µM zinc chlorin cytochrome $b_{562}$/4.4 mM KPi (pH 7.2) solution (60 µL). In addition to the zinc chlorin cytochrome $b_{562}$-immobilized gold drop electrode, gold drop electrodes were also prepared that were immersed only in zinc chlorin (ZnCe6) and in chlorin (Ce6).

Photocurrent was measured in 10 mM sodium phosphate (pH 7.0) purged with nitrogen, using Ag/AgCl as the reference electrode, and a Pt mesh electrode as the counter electrode.

Figure 13:
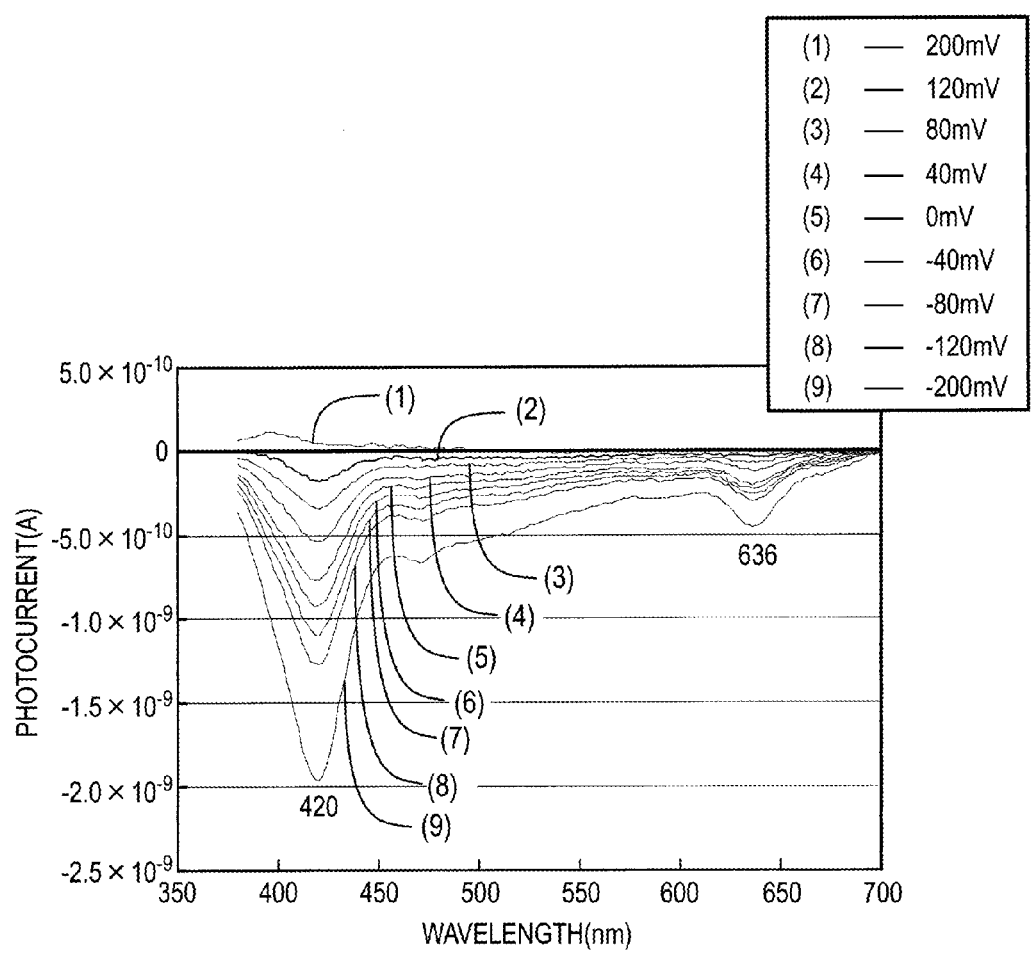
FIG. 13 is a schematic diagram representing the photocurrent action spectra obtained with a zinc chlorin cytochrome $b_{562}$-immobilized gold drop electrode.

FIG. 13 represents the photocurrent action spectra at the bias voltages of 200 mV to −200 mV. Measurements were made for the zinc chlorin cytochrome $b_{562}$-immobilized gold drop electrode dipped in a 10 mM NaPi (pH 7.0) buffer. As shown in FIG. 13, cathodic photocurrents are observed in the zinc chlorin cytochrome $b_{562}$-immobilized gold drop electrode. Current response is also observed at 636 nm in the red band, in addition to 420 nm in the blue band. This is the world first case of red light responsive photocurrent observation in the zinc porphyrin protein photoelectric conversion device.

Figure 14:
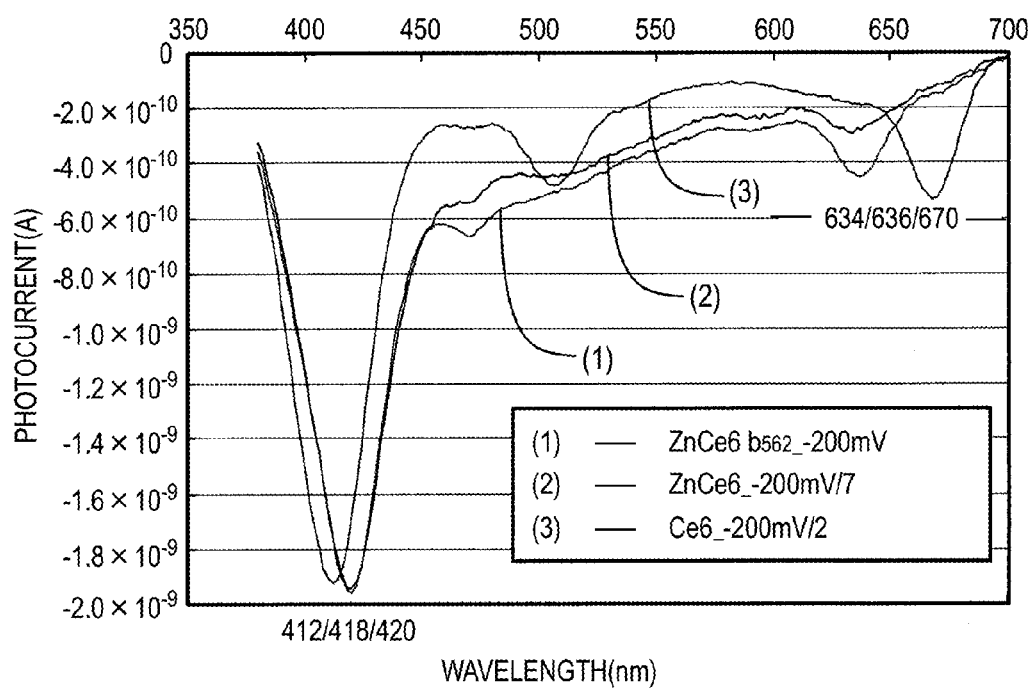
FIG. 14 is a schematic diagram representing the photocurrent action spectra obtained with a zinc chlorin cytochrome $b_{562}$-immobilized gold drop electrode, a zinc chlorin-immobilized gold drop electrode, and a chlorin-immobilized gold drop electrode.

FIG. 14 compares the photocurrent action spectra between the zinc chlorin cytochrome $b_{562}$-immobilized gold drop electrode, and the gold drop electrodes immobilizing only the zinc chlorin (ZnCe6) and only the chlorin (Ce6). The bias voltage is −200 mV vs Ag/AgCl. As shown in FIG. 14, the photocurrent action spectrum of the zinc chlorin cytochrome $b_{562}$-immobilized gold drop electrode is shifted towards the red (red shift) by about 2 nm compared with the spectrum of the zinc chlorin-immobilized gold drop electrode. Further, the bulge near 460 nm wavelength does not occur in the spectrum of the zinc chlorin-immobilized gold drop electrode. It is therefore considered that the surrounding environment of the pigment is different for the zinc chlorin cytochrome $b_{562}$ and the zinc chlorin. The photocurrent amount is greater for the zinc chlorin-immobilized gold drop electrode than for the zinc chlorin cytochrome $b_{562}$-immobilized gold drop electrode. This is considered to be due to the greater adsorption of the zinc chlorin than the zinc chlorin cytochrome $b_{562}$ by the gold drop electrode.

Figure 15:
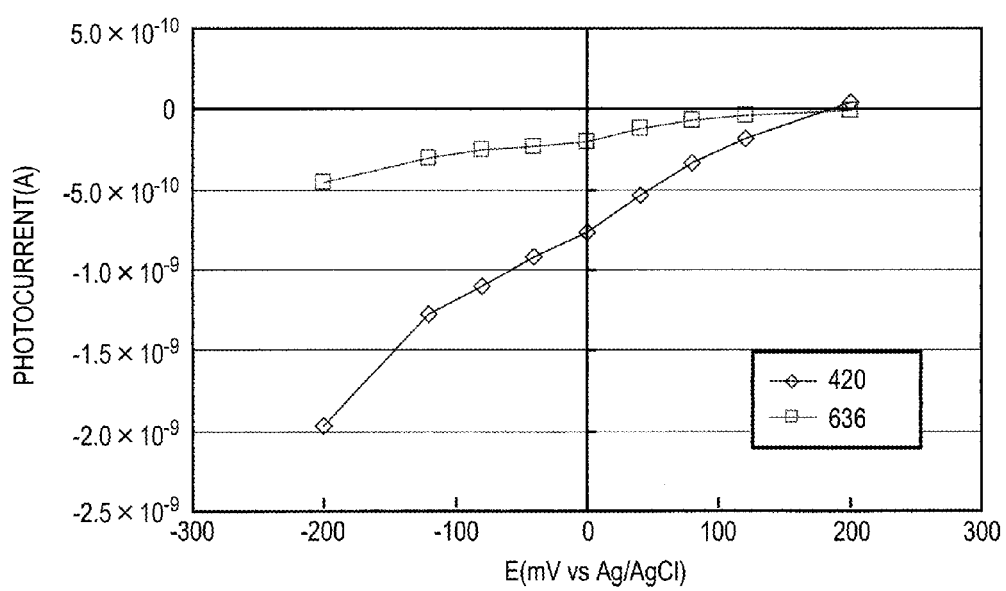
FIG. 15 is a schematic diagram representing the current-voltage curves obtained with a zinc chlorin cytochrome $b_{562}$-immobilized gold drop electrode.

FIG. 15 is a graph representing the photocurrent values at 420 nm and 636 nm wavelengths plotted against potential E. As shown in FIG. 15, no anodic current was observed even under applied positive voltage. The current-voltage curve represented in FIG. 15 shows a diode-like behavior. The same tendency was observed also for the zinc chlorin-immobilized gold drop electrode and the chlorin-immobilized gold drop electrode. This tendency was also observed in the zinc-substituted cytochrome $b_{562}$-immobilized gold drop electrode of Example 2 (see FIG. 9).

Example 4 a. Preparation of Triptophan and Cysteine Variants of Cytochrome $b_{562}$

The expression plasmid of Example 1 and the primers below (mutation sites are underlined) were used to prepare I17W/H63N (change from isoleucine 17 to triptophan, and histidine 63 to asparagine) variant, and I17C/H63N (change from isoleucine 17 to cysteine, and histidine 63 to asparagine) variant plasmids, using the QuickChange Lightning Site directed mutagenesis kit (Stratagene). Note that the H63N mutation is for avoiding the zinc porphyrin from forming a coordinate bond with the histidine during the zinc porphyrin reconstitution (see Mennenga, A., Gartner, W., Lubitz, W. and Gorner, H. Phys. Chem. Chem. Phys. 8, 5444 (2006)). Amino acid residues other than isoleucine 17 may be changed to triptophan.

```
I17W_sen:
5'-CAATTTAAAAGTGTGGGAAAAAGCGGATAAC-3'

I17W_ans:
5'-CCGCTTTTTCCCACACTTTTAAATTGTCGTTGAGG-3'

I17C_sen:
5'-CAATTTAAAAGTGTGCGAAAAAGCGGATAAC-3'

I17C_ans:
5'-CCGCTTTTTCGCACACTTTTAAATTGTCGTTGAGG-3'
```

```
H63N_sen:
5'-GATTTCCGCAACGGTTTCGACATTCTG-3'

H63N_ans:
5'-GTCGAAACCGTTGCGGAAATCTTTC-3'
```

These plasmids were transformed into *Escherichia coli* JM109, and cytochrome $b_{562}$_I17W/H63N and cytochrome $b_{562}$_I17C/H63N were prepared after the culturing and the expression and purification procedures of Example 1.

b. Preparation of Quinone-Introduced Apocytochrome $b_{562}$ Variant

The purified cytochrome $b_{562}$_I17C/H63N was dehemed using an acid-butanone method as in Example 2, and dialyzed against ultrapure water (2 L×3 times), 1 mM DTT (2 L×1 time), 1 mM acetate-Na, pH 5.0, and 100 mM KCl (2 L×1 time) to prepare an apoprotein.

Parabenzoquinone (BQ) or 2,3-dimethoxy-5-methyl parabenzoquinone (CoQ) was then added in 5 times the molar amount to the apoprotein, and the mixture was incubated at room temperature for 30 min in 50 mM sodium phosphate (pH 7.0). The reaction solution was dialyzed against 1 mM sodium phosphate (pH 7.0) (1 L×2 times) and ultrapure water (1 L×1 time) to prepare a quinone-modified product. The BQ and CoQ products were pale magenta and pale yellow in color, respectively.

Figure 17:
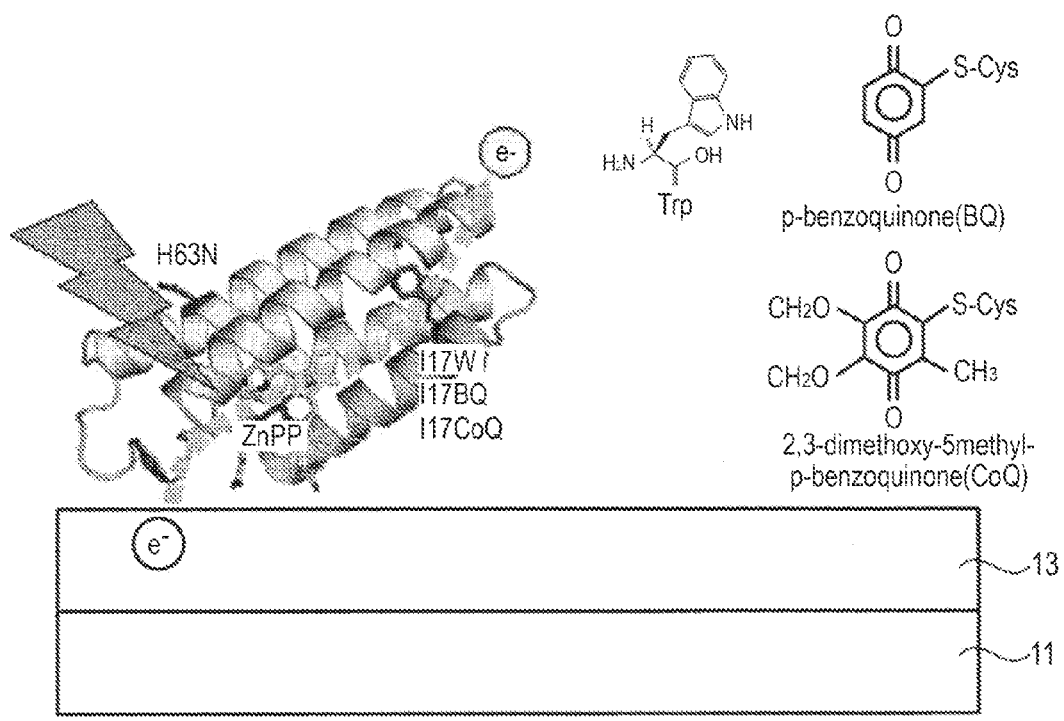
FIG. 17 is a schematic diagram representing how the zinc-substituted cytochrome $b_{562}$_I17X/H63N is adsorbed on a gold electrode via a self-assembled monolayer.

Concerning this method, it has been reported that the quinone binds to a free cysteine residue, as shown on the right-hand side of FIG. 17 (described later). It is considered that the quinone binds to cysteine 17, the only cysteine present in this protein.

c. Preparation of Zinc-Substituted Cytochrome $b_{562}$_I17C/H63N

Figure 16:
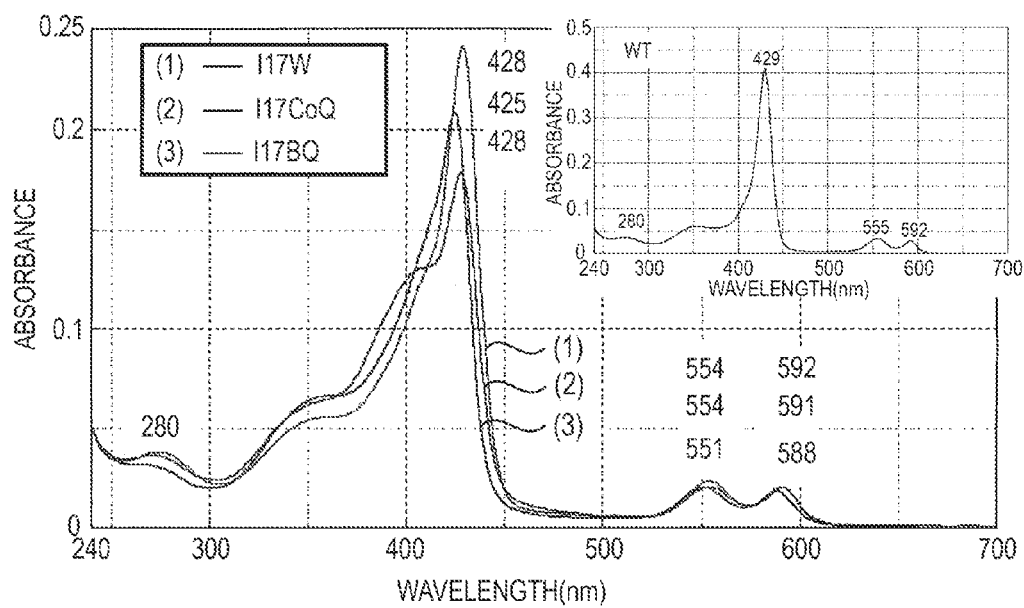
FIG. 16 is a schematic diagram representing the absorption spectra of zinc-substituted cytochrome $b_{562}$_I17X/H63N.

Zinc protoporphyrin (ZnPP) was added to the quinone-introduced apoprotein in 2.2 to 2.5 times the amount of the quinone-introduced apoprotein, and the protein fraction was collected using a Bio-rad EconoPac10 DG desalting column (50 mM Tris-HCl (pH 8.0) and 0.1 mM EDTA were used as the buffer). FIG. 16 represents the absorption spectra of the zinc-substituted cytochrome $b_{562}$_I17C/H63N. The insert on the upper right of FIG. 16 is the absorption spectrum of the wild-type (WT).

d. Immobilization of Zinc-Substituted Cytochrome $b_{562}$ Variant on Gold Drop Electrode and Photocurrent Measurement The zinc-substituted cytochrome $b_{562}$_I17C/H63N obtained as above was immobilized on a gold drop electrode using 11-aminoundecanethiol, as in Example 1. FIG. 17 represents a schematic view of the zinc-substituted cytochrome $b_{562}$_I17C/H63N adsorbed on the self-assembled monolayer 13 formed on the gold electrode 11 (gold drop electrode). In FIG. 17, the amino acid 17 (W, BQ, CoQ) and the asparagine 63 (H63N) are shown in a rod model. Shining light on the zinc-substituted cytochrome $b_{562}$_I17C/H63N-immobilized gold drop electrode causes electrons (e⁻) to jump out of the electrode towards the molecule surface, as indicated by broken line. FIG. 17 also represents the structures of triptophan (Trp), parabenzoquinone (BQ) attached to cysteine (Cys), and 2,3-dimethoxy-5-methylparabenzoquinone (CoQ) attached to cysteine.

Photocurrent was measured in 10 mM sodium phosphate (pH 7.0) purged with nitrogen, using Ag/AgCl as the reference electrode, and a Pt mesh electrode as the counter electrode.

Figure 18:
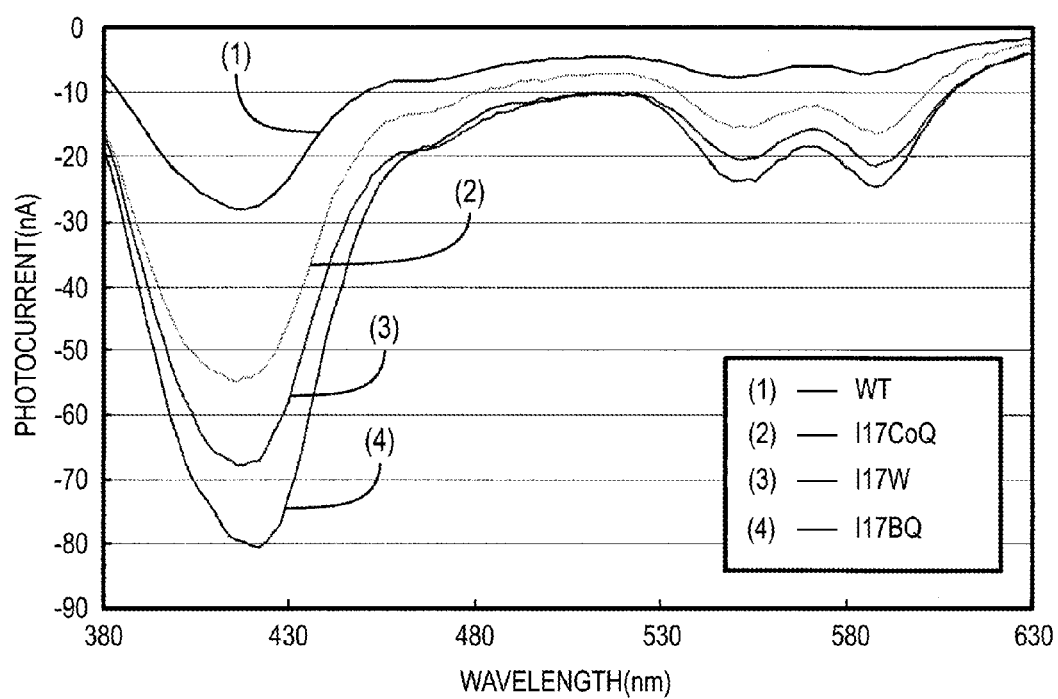
FIG. 18 is a schematic diagram representing the photocurrent action spectra obtained with a zinc-substituted cytochrome $b_{562}$_I17X/H63N-immobilized gold drop electrode.
Figure 19:
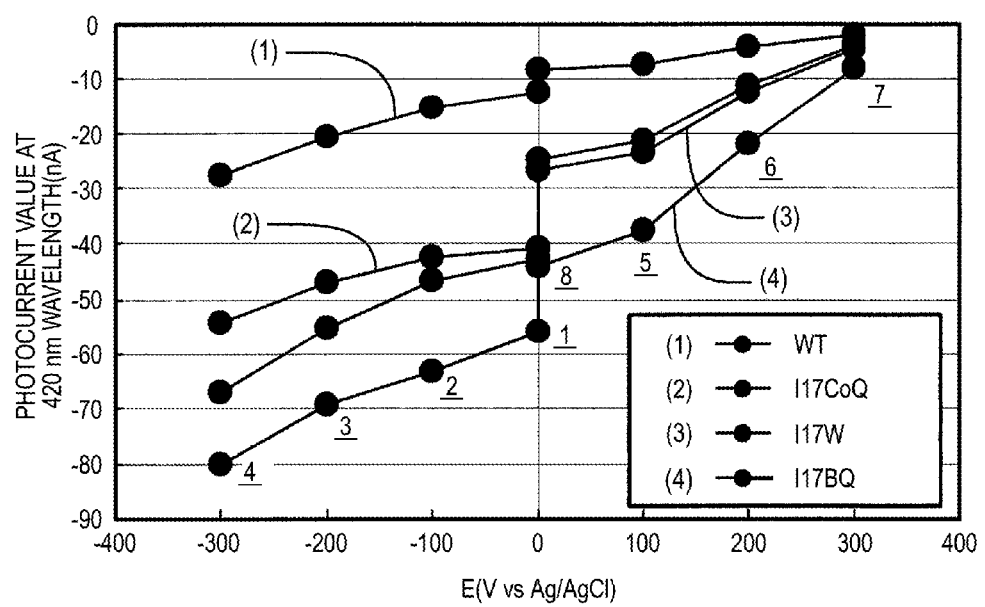
FIG. 19 is a schematic diagram representing the photocurrent action spectra obtained with a zinc-substituted cytochrome $b_{562}$_I17X/H63N-immobilized gold drop electrode, a ZnPP-immobilized gold drop electrode, and a wild-type zinc-substituted cytochrome $b_{562}$-immobilized gold drop electrode.

FIG. 18 represents the photocurrent action spectra of the gold drop electrodes immobilizing the zinc-substituted cytochrome $b_{562}$_I17X/H63N (X=CoQ, W, BQ) and the wild-type zinc-substituted cytochrome $b_{562}$. The bias voltage is −300 mV vs Ag/AgCl. As represented in FIG. 18, the photocurrents of the I17W, I17CoQ, and I17BQ variants were 2 to 3 times greater than the photocurrent of the wild-type in the generated cathodic current. It is therefore considered that these variant residues increase the photocurrent. FIG. 19 represents a graph of photocurrent values at 420 nm wavelength plotted against potential E. In FIG. 19, the numbers on the current-voltage curve represent the order in which the data were acquired.

Shih, C., Museth, A. K., Abrahamsson, M., Blanco-Rodriguez, A. M., Bilio, A. J. D. and 8 others, Science, 320, 1760 (2008) reports improving the rhenium-copper electron transfer speed by two orders of magnitude by introducing tryptophan to a copper protein and azurin modified with a rhenium complex (2170.pdb). However, in this publication, tryptophan is disposed on the surface of the protein molecule. Example 4, on the other hand, represents a world first report of tryptophan being introduced into the protein molecule to increase photocurrent.

The photocurrent values of 50 to 80 nA obtained in the experiment using the gold drop electrode translate into values about 50 to 80 times greater than the photocurrent values obtained in the experiment conducted in JP-A-2007-220445.

Figure 20:
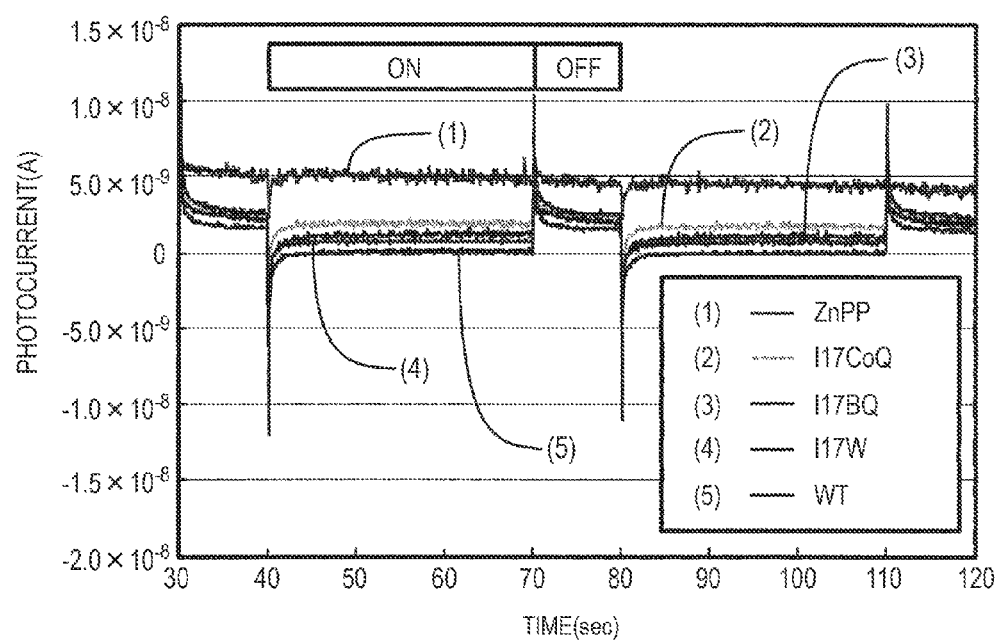
FIG. 20 is a schematic diagram representing the photocurrent real-time waveforms obtained with a zinc-substituted cytochrome $b_{562}$_I17X/H63N-immobilized gold drop electrode, a ZnPP-immobilized gold drop electrode, and a wild-type zinc-substituted cytochrome $b_{562}$-immobilized gold drop electrode.

FIG. 20 represents the measured photocurrents (photocurrent real-time waveforms) of the zinc-substituted cytochrome $b_{562}$_I17X/H63N-immobilized gold drop electrode, and the measured photocurrents of the gold drop electrodes immobilizing only the wild-type zinc-substituted cytochrome $b_{562}$ and only the ZnPP at the bias voltage of 300 mV (vs Ag/AgCl). As the buffer, 10 mM sodium phosphate (pH 7.0) was used. In FIG. 20, the current value is plotted against time in 30 seconds of irradiation with the light of 420 nm wavelength followed by a 10-second off period. As shown in FIG. 20, in contrast to the zinc-substituted cytochrome $b_{562}$_I17X/H63N-immobilized gold drop electrode that generated cathodic photocurrent (though small), the ZnPP-immobilized gold drop electrode did not generate any cathodic photocurrent.

Figure 21:
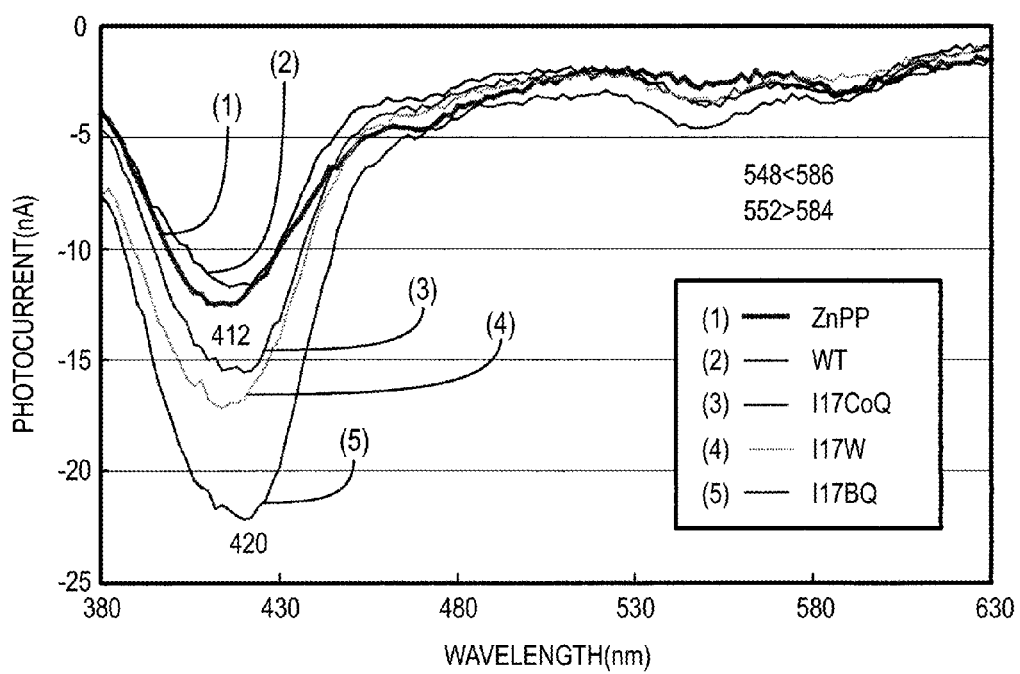
FIG. 21 is a schematic diagram representing the photocurrent action spectra obtained with a zinc-substituted cytochrome $b_{562}$_I17X/H63N-immobilized gold drop electrode, a ZnPP-immobilized gold drop electrode, and a wild-type zinc-substituted cytochrome $b_{562}$-immobilized gold drop electrode.

FIG. 21 represents the photocurrent action spectrum of the zinc-substituted cytochrome $b_{562}$_I17X/H63N-immobilized gold drop electrode, and the photocurrent action spectrum of the gold drop electrode immobilizing the wild-type zinc-substituted cytochrome $b_{562}$ or ZnPP alone at the bias voltage of 0 mV (vs Ag/AgCl). As the buffer, 10 mM sodium phosphate (pH 7.0) was used. As shown in FIG. 21, the photocurrent action spectra are different for the ZnPP alone and the inclusion in the zinc-substituted cytochrome $b_{562}$_I17X/H63N. Thus, it can be said that the photocurrents observed in FIG. 18 originate in the protein.

Effect of Methyl Viologen in the Generation of Photocurrent by Zinc-Substituted Cytochrome $b_{562}$ According to JP-A-2007-220445, adding the mediator ferro/ferricyanide (E0=360 mV vs NHE) to a zinc-substituted cytochrome c-immobilized electrode enhances photocurrent. The photoirradiation excites the porphyrin electrons, and holes generate in the two occupied orbitals (hybrids of the porphyrin π orbital and the zinc-sulfur H binding orbital) of the molecular orbitals (4 Gouterman orbitals) associated with photoexcitation. The holes strongly couple with the molecular orbitals localized on the outer shell amino acids of the protein, and the generated holes on the pigment move to the protein outer shell (solution side). The publication thus proposes a model where the ferro/ferricyanide fills the holes.

However, adding ferro/ferricyanide did not have effect on photocurrent in the series of experiments using the zinc-substituted cytochrome $b_{562}$. In fact, only cathodic photocurrents were observed from the zinc-substituted cytochrome $b_{562}$-immobilized electrode. Further, it is considered from the diode-like behavior that the excited electrons move towards the molecule surface. To test this, photocurrent was measured by adding methyl viologen (E0=−440 mV vs NHE) that has the excited electron enhancing effect, according to Yasutomi, S., Morita, T., Imanishi, Y. and Kimura, S. Science, 304, 1944 (2004).

Figure 22:
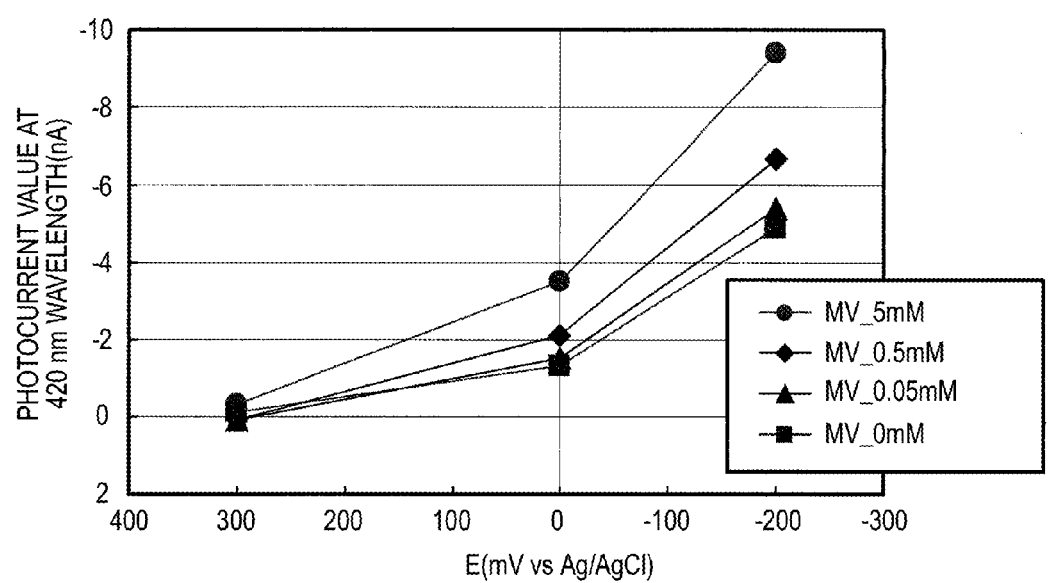
FIG. 22 is a schematic diagram representing the current-voltage curves obtained with a wild-type zinc-substituted cytochrome $b_{562}$-immobilized gold drop electrode with varying addition amounts of methyl viologen.
Figure 23:
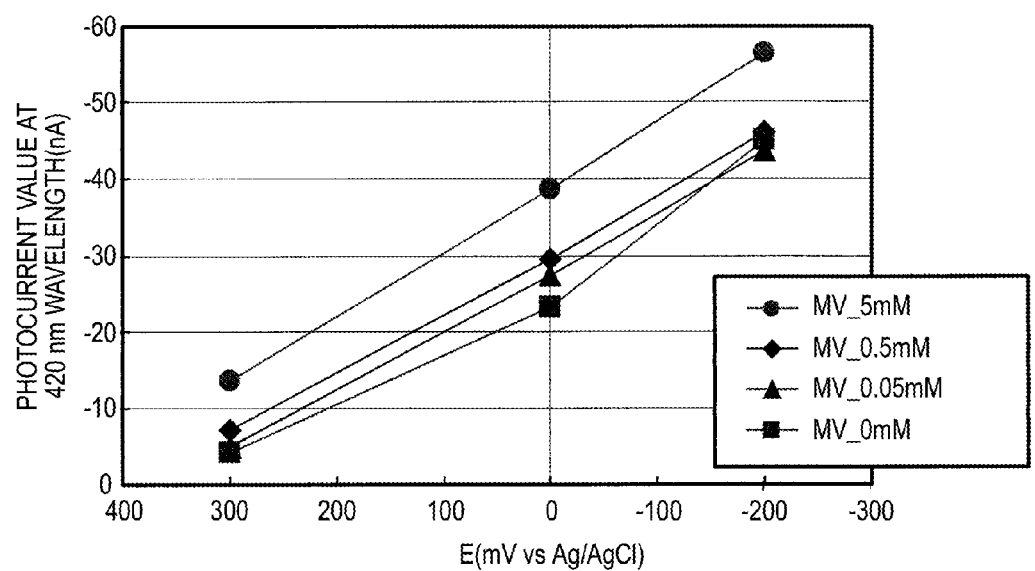
FIG. 23 is a schematic diagram representing the current-voltage curves obtained with a zinc-substituted cytochrome $b_{562}$_I17W/H63N-immobilized gold drop electrode with varying addition amounts of methyl viologen.

FIG. 22 represents the effect of methyl viologen (MV) on the photocurrent generation by the gold drop electrode immobilizing the wild-type zinc-substituted cytochrome $b_{562}$. FIG. 23 represents the effect of methyl viologen on the photocurrent generation by the gold drop electrode immobilizing the zinc-substituted cytochrome $b_{562}$_I17W/H63N. In FIGS. 22 and 23, the horizontal axis (bias voltage) and the vertical axis (photocurrent values at 420 nm wavelength) are inverted to help grasp the increasing cathodic photocurrent. As represented in FIGS. 22 and 23, adding methyl viologen increased the photocurrent amounts in both the wild-type and the tryptophan mutant. It is thus highly likely that the zinc-substituted cytochrome $b_{562}$ photocurrent originates in the movement of the excited electrons, not the hole movement. This phenomenon also can be explained by the all-electron calculation of the zinc-substituted cytochrome $b_{562}$.

X-Ray Crystalline Structure Analysis of Triptophan Mutant Cytochrome $b_{562}$

Figure 24:
FIG. 24 is a photographic representation of cytochrome $b_{562}$_I17W/H63N crystals observed under an optical microscope.

A cytochrome $b_{562}$_I17W/H63N solution (10 mM acetate-Na, pH 5.0; 30 mg/mL) was mixed with equal amounts of 0.1 M Bis-Tris, pH 6.5, and 45% poly(propylene glycol) P400 (Index-58), and the mixture was incubated at 20° C. for 2 days using the sitting drop vapor diffusion technique and the hanging drop vapor diffusion technique. As a result, cytochrome $b_{562}$_I17W/H63N crystals were obtained, as shown in FIG. 24. The length between the arrowheads in FIG. 24 is 0.1 mm. The crystals were twin crystals of a space group P1, and diffraction data were obtained at 2.53 Å resolution. The statistical values are presented in Table 1.

TABLE 1

|  | Cyt b562_I17W/H63N |
| --- | --- |
| Data Collection | |
| Space group | P1 (twinned) |
| a, b, c (Å) | 48.37, 48.40, 93.66 |
| α, β, γ (°) | 77.61, 79.57, 63.68 |
| Twin fractions | H, K, L = 0.876 |
|  | −K, −H, −L = 0.124 |
| Resolution (Å) | 30.34-2.53 (2.62-2.53) |
| Redundancy | 1.89 (1.92) |
| Completeness (%) | 92.4 (90.4) |
| Rmerge (%) | 7.9 (29.7) |
| I/σI | 6.7 (2.2) |
| Refinement | |
| Resolution (Å) | 20.0-2.53 |
| Number of reflections | 21,554 |
| R/Rfree | 25.8/29.2 |

TABLE 1-continued

|  | Cyt b562_I17W/H63N |
| --- | --- |
| Number of atoms | |
| Protein | 5061 |
| Hetero | 258 |
| Water | 28 |
| Average β-factors | |
| Protein | 29.3 |
| Hetero | 26.8 |
| Water | 27.3 |
| Root-mean-square deviation | |
| Bond lengths (Å) | 0.010 |
| Bond angles (°) | 1.139 |

Numbers in parentheses are statistical values for high-resolution cells

Figure 25:
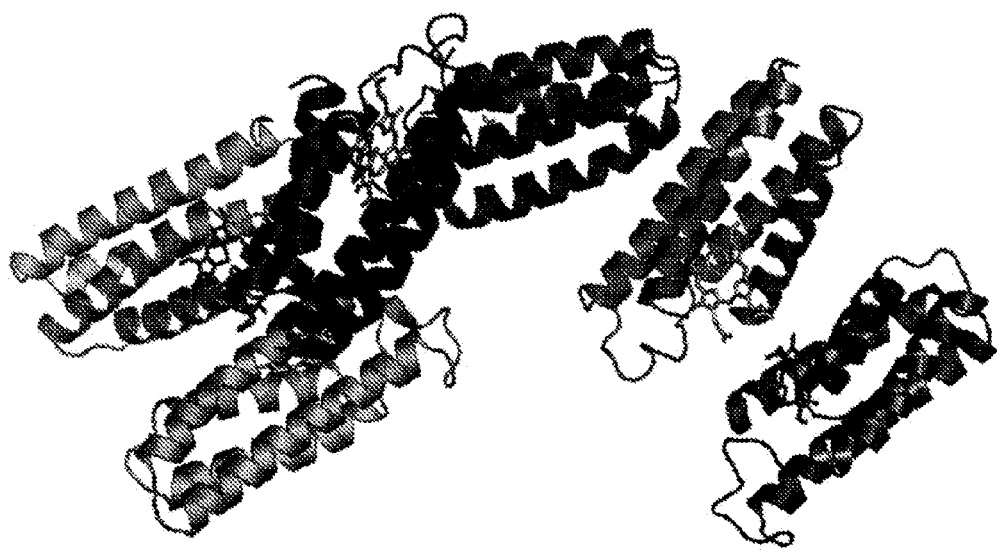
FIG. 25 is a schematic diagram representing a unit cell of cytochrome $b_{562}$_I17W/H63N crystals.
Figure 26:
FIG. 26 is a schematic diagram representing the structure of cytochrome $b_{562}$_I17W/H63N in the vicinity of triptophan 17.

Molecular replacement was effected with program Molrep/CCP4, using only the chain A in the structure of the wild-type cytochrome $b_{562}$ (256B.pdb) (heteromolecule excluding the heme, coordinates data with the deletion of chain B in the dimer) as a template. As represented in FIG. 25, the cytochrome $b_{562}$_I17W/H63N crystals contain six molecules per unit cell. FIG. 26 is a stereographic representation of the structure in the vicinity of tryptophan 17 in the cytochrome $b_{562}$_I17W/H63N, showing the all six molecules of the unit cell in layers. The orientation of the tryptophan 17 (Trp17) side chain is the same for the all molecules.

Program Refmac5/CCP4 was used for Rigidbody→Restrained→TLS refinement (all used amplitude based twin refinement), and a manual model was constructed with Coot. I17W and H63N mutations were incorporated. Detailed statistical values are presented in Table 1.

Figure 27:
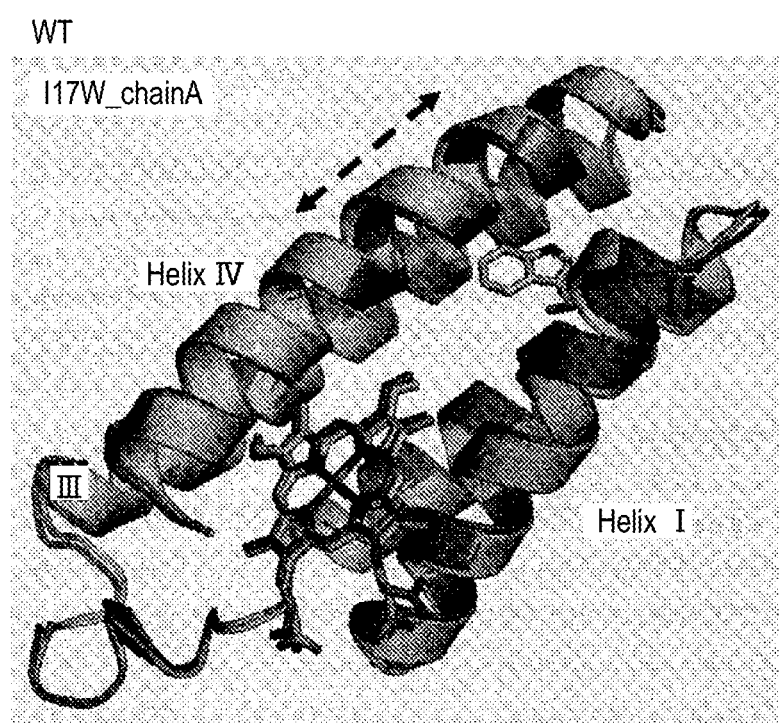
FIG. 27 is a schematic diagram comparing the A chain between wild-type cytochrome $b_{562}$ and cytochrome $b_{562}$_I17W/H63N.
Figure 28:
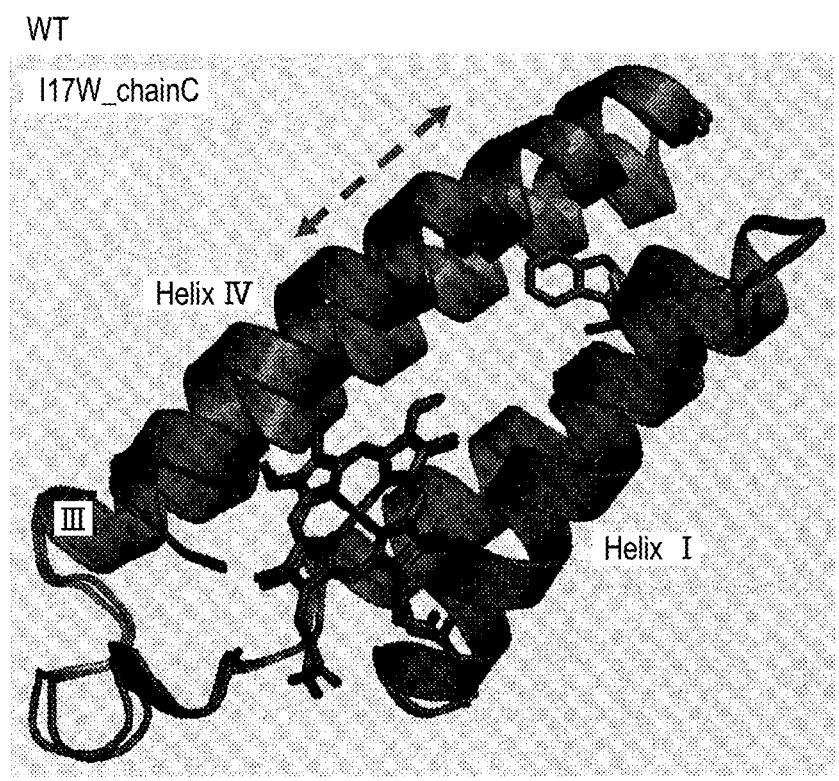
FIG. 28 is a schematic diagram comparing the C chain between wild-type cytochrome $b_{562}$ and cytochrome $b_{562}$_I17W/H63N.

FIG. 27 is a diagram comparing the A chain (one of the six molecules of the unit cell) between the cytochrome $b_{562}$_I17W/H63N and the wild-type cytochrome $b_{562}$. FIG. 28 is a diagram comparing the C chain (one of the six molecules of the unit cell) between the cytochrome $b_{562}$_I17W/H63N and the wild-type cytochrome $b_{562}$. In FIGS. 27 and 28, the heme and tryptophan 17 are shown in a rod model. As represented in FIGS. 27 and 28, the whole structure of the cytochrome $b_{562}$_I17W/H63N maintained the 4-helix bundle structure of the wild-type cytochrome $b_{562}$. In FIGS. 27 and 28, the Helix IV opposite the tryptophan 17 is pushed away towards the outer side of the molecule (broken arrows). The r.m.s. (root-mean-square) deviation of the amino acid α carbon was about 0.5 Å between the wild-type cytochrome $b_{562}$ and the cytochrome $b_{562}$_I17W/H63N. All the six molecules had the same tryptophan 17 side chain conformer (see FIG. 26), showing that the position and orientation of the side chain was the general solution.

Figure 29:
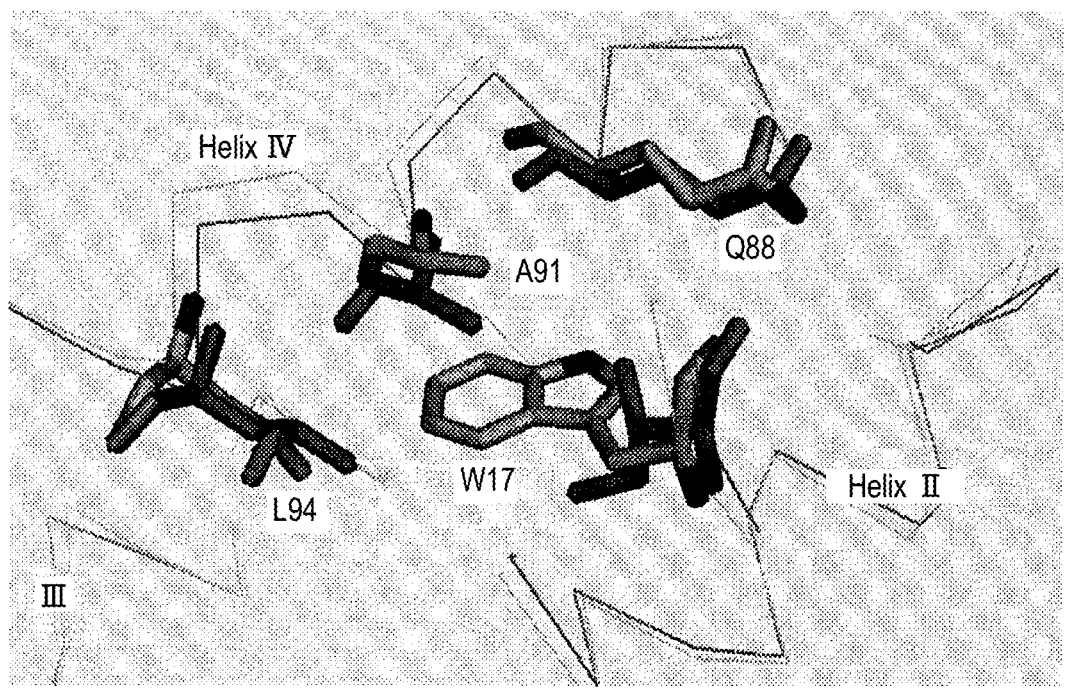
FIG. 29 is a schematic diagram representing the structures of wild-type cytochrome $b_{562}$ and cytochrome $b_{562}$_I17W/H63N in the vicinity of the triptophan 17 on the A chain.
Figure 30:
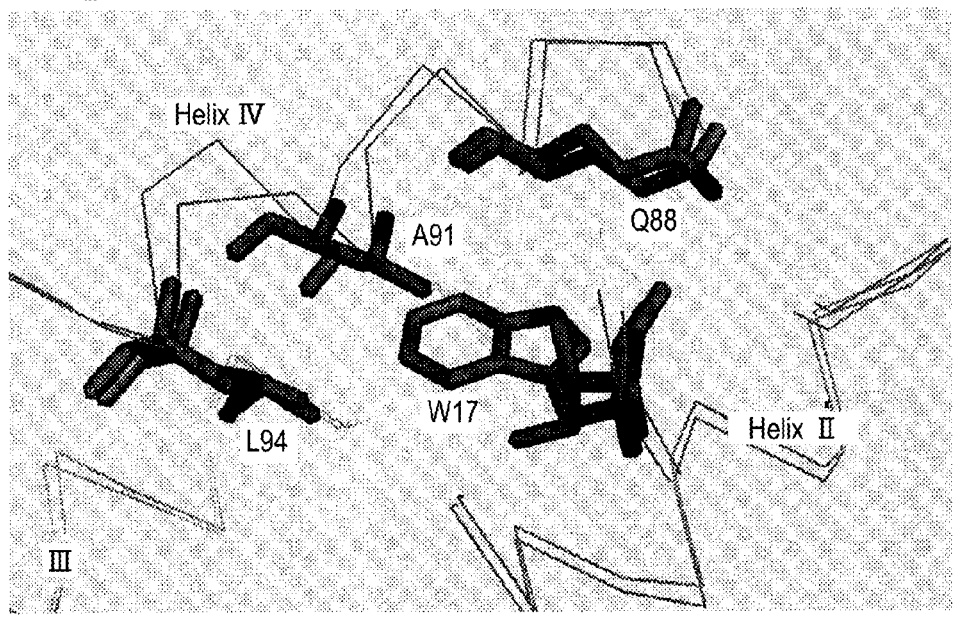
FIG. 30 is a schematic diagram representing the structures of wild-type cytochrome $b_{562}$ and cytochrome $b_{562}$_I17W/H63N in the vicinity of the triptophan 17 on the C chain.

FIG. 29 is a diagram comparing the structures in the vicinity of the tryptophan 17 on A chain between the cytochrome $b_{562}$_I17W/H63N and the wild-type cytochrome $b_{562}$. FIG. 30 is a diagram comparing the structures in the vicinity of the tryptophan 17 on C chain between the cytochrome $b_{562}$_I17W/H63N and the wild-type cytochrome $b_{562}$. In FIGS. 29 and 30, tryptophan 17, glutamine 88, alanine 91, and leucine 94 are shown in a rod model. The other portions are amino acid α carbon traces. I17W is at the center of the 4-helix bundle. The change from isoleucine to tryptophan at amino acid 17 pushes the arrangement in the vicinity of alanine 90 and alanine 91 more towards the molecule surface than in the wild-type by 1 to 2 Å. Accordingly, the orientation of the leucine 94 is changed.

It is considered that the cytochrome $b_{562}$_I17W/H63N and the wild-type cytochrome $b_{562}$ are adsorbed on the gold electrode in a similar fashion, because the whole structures of the cytochrome $b_{562}$_I17W/H63N and the wild-type cytochrome $b_{562}$ are not greatly different (FIGS. 27 and 28).

As described above, in First Embodiment, the protein-immobilized electrode can be obtained in which the protein 12 of the cytochrome $b_{562}$, metal-substituted cytochrome $b_{562}$, zinc chlorin cytochrome $b_{562}$, or a derivative or a variant thereof is immobilized on the gold electrode 11. To the knowledge of the present inventors, the present disclosure is the first case that successfully immobilized such proteins, including cytochrome $b_{562}$, metal-substituted cytochrome $b_{562}$, and zinc chlorin cytochrome $b_{562}$, on the gold electrode 11. For example, by using the zinc-substituted cytochrome $b_{562}$ as the protein 12, a protein-immobilized electrode can be obtained that responds to blue light. This protein-immobilized electrode can then be used to realize a protein photoelectric conversion device for blue light. Further, by using the zinc chlorin cytochrome $b_{562}$ as the protein 12, a protein-immobilized electrode can be obtained that responds to red light. This protein-immobilized electrode can then be used to realize a protein photoelectric conversion device for red light.

2. Second Embodiment

Protein Photoelectric Conversion Device

Figure 31:
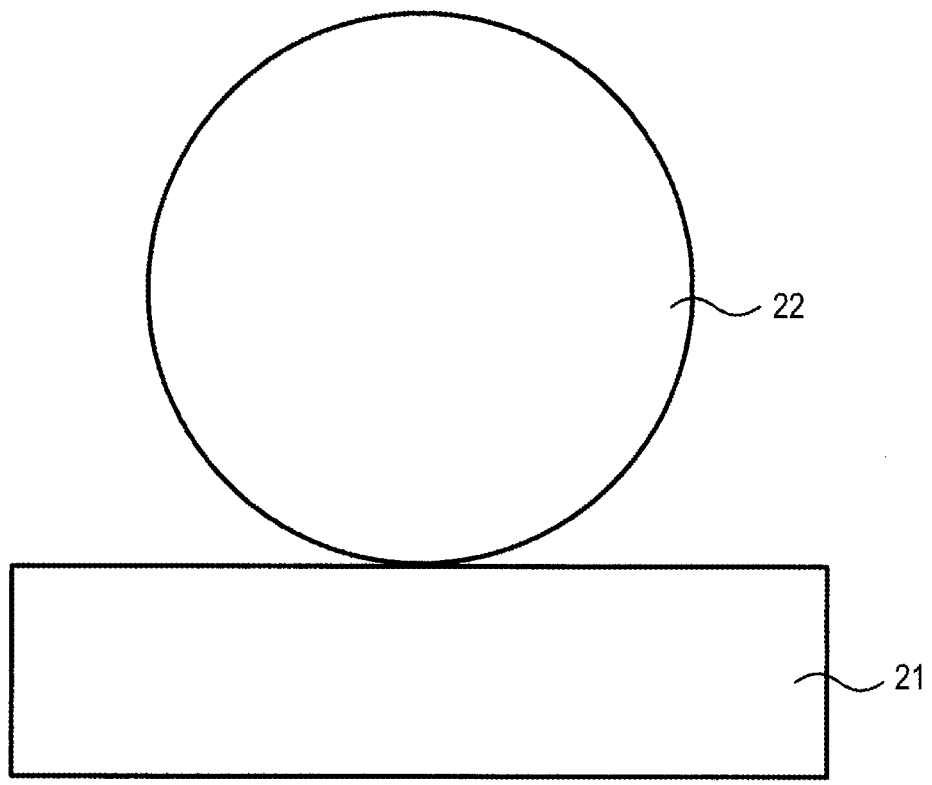
FIG. 31 is a schematic diagram illustrating a protein photoelectric conversion device according to Second Embodiment of the present disclosure.

FIG. 31 illustrates a protein photoelectric conversion device according to Second Embodiment, specifically a protein-immobilized electrode.

As illustrated in FIG. 31, the protein photoelectric conversion device includes a protein-immobilized electrode with a protein 22 of zinc-substituted cytochrome $b_{562}$ or zinc chlorin cytochrome $b_{562}$ immobilized on a gold electrode 21. The protein-immobilized electrode does not differ from its counterpart in First Embodiment except for this configuration.

In addition to the protein-immobilized electrode that includes the protein 22 of zinc-substituted cytochrome $b_{562}$ or zinc chlorin cytochrome $b_{562}$ immobilized on the gold electrode 21, the protein photoelectric conversion device includes a counter electrode. The counter electrode is provided opposite from the protein-immobilized electrode with a gap in between. The counter electrode may be made of various inorganic materials, as represented by, for example, metals such as gold, aluminum, palladium, silver, and chromium, and metal oxides and glasses such as ITO (indium-tin composite oxide), FTO (fluorine-doped tin oxide), and NESA glass ($SnO_2$ glass). The counter electrode may also be formed using conductive polymers (such as polythiophene, polypyrrole, polyacetylene, polydiacethylene, polyparaphenylene, and polyparaphenylenesulfide), and charge-transfer complexes (for example, TTF-TCNQ) that include tetrathiafulvalene derivatives (such as TTF, TMTSF, BEDT-TTF). Preferably, the counter electrode is configured as a transparent electrode for the light used for the photoexcitation of the protein 22, so that the light can pass through the counter electrode and shine the whole part or substantially the whole part of the protein 22 immobilized on the gold electrode 21. For example, the counter electrode may be configured from a transparent conductive material, for example, such as ITO, FTO, and NESA glass, that is transparent to the light used for the photoexcitation of the protein 22, or from an ultrathin metal film that allows for passage of the light.

The protein photoelectric conversion device can be operated in a solution (electrolytic solution or buffer) or in a dry environment, provided that the photoelectric conversion function and the electron transfer function of the protein 22 are not lost. When the protein photoelectric conversion device is operated in an electrolytic solution or buffer, the counter electrode is typically provided opposite the protein-immobilized electrode with a gap, and the protein-immobilized electrode and the counter electrode are dipped in the electrolytic solution or buffer. The electrolyte (or redox species) used for the electrolytic solution may be a material that causes oxidation reaction at the protein-immobilized electrode or reduction reaction at the counter electrode, or a material that causes reduction reaction at the protein-immobilized electrode or oxidation reaction at the counter electrode. Specifically, materials, for example, such as $K_4[Fe(CN)_6]$ and $[Co(NH_3)_6]Cl_3$ are used as the electrolyte (or redox species). When the protein photoelectric conversion device is operated in a dry environment, for example, a solid electrolyte that does not adsorb the protein 22, specifically, a wet solid electrolyte, for example, such as agar and polyacrylamide gel, is typically sandwiched between the protein-immobilized electrode and the counter electrode, and a sealing wall is preferably provided around the solid electrolyte to prevent the solid electrolyte from drying. In these cases, photocurrent can be obtained at the polarity that is based on the difference in the natural electrode potential between the protein-immobilized electrode and the counter electrode in response to the light received at the photoreceptor realized by the protein 22.

Usage of Protein Photoelectric Conversion Device

Figure 32:
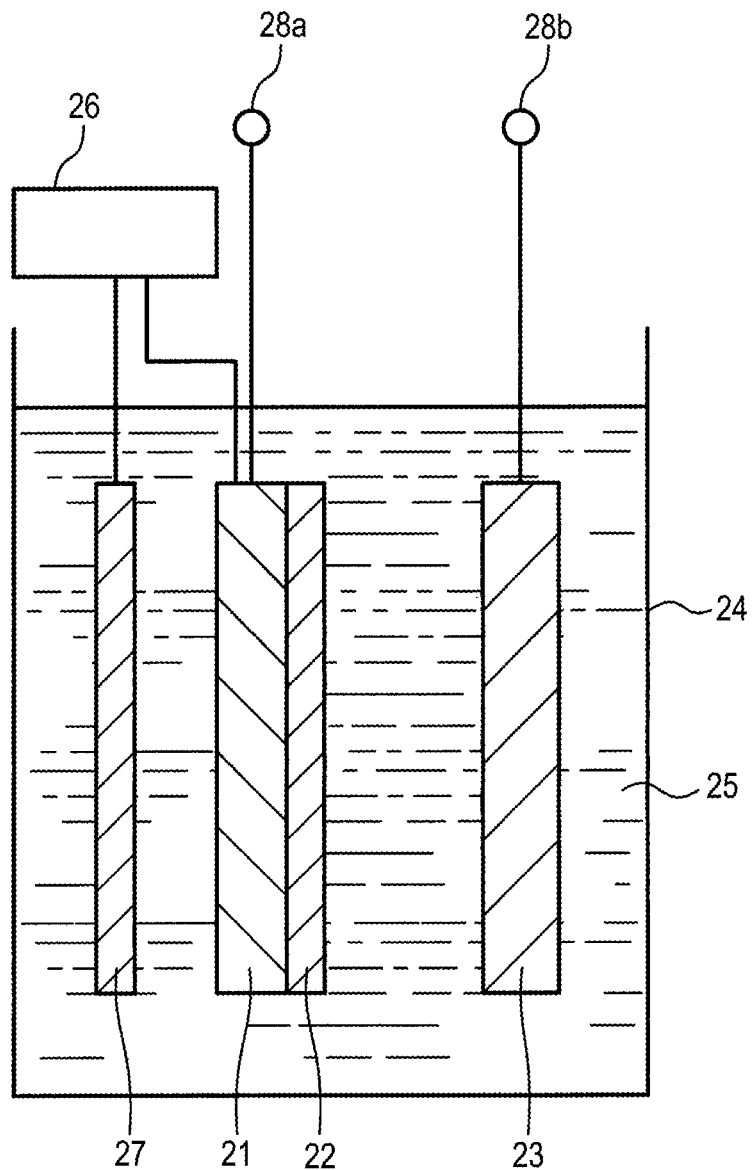
FIG. 32 is a schematic diagram representing a first exemplary usage of the protein photoelectric conversion device according to Second Embodiment of the present disclosure.

FIG. 32 represents a first exemplary usage of the protein photoelectric conversion device.

As illustrated in FIG. 32, in the first example, the protein-immobilized electrode immobilizing the protein 22 on the gold electrode 21, and the counter electrode 23 are disposed face to face. The protein-immobilized electrode and the counter electrode 23 are dipped in an electrolytic solution 25 charged into a container 24. The electrolytic solution 25 is selected from materials that do not lose the functions of the protein 22. The electrolyte (or redox species) used for the electrolytic solution 25 is a material that causes oxidation reaction at the protein-immobilized electrode or reduction reaction at the counter electrode 23, or a material that causes reduction reaction at the protein-immobilized electrode or oxidation reaction at the counter electrode 23.

For the photoelectric conversion with the protein photoelectric conversion device, light is shone on the protein 22 of the protein-immobilized electrode while applying a bias voltage to the protein-immobilized electrode with respect to the reference electrode 27 from a bias power supply 26. The light is either a monochromatic component of the light that can photoexcite the protein 22, or light that has a component of such light. In this case, the magnitude and/or polarity of the photocurrent that flows inside the device can be varied by adjusting at least one of the bias voltage applied to the protein-immobilized electrode, the intensity of the irradiation light, and the wavelength of the irradiation light. The photocurrent is taken out at terminals 28a and 28b.

Figure 33:
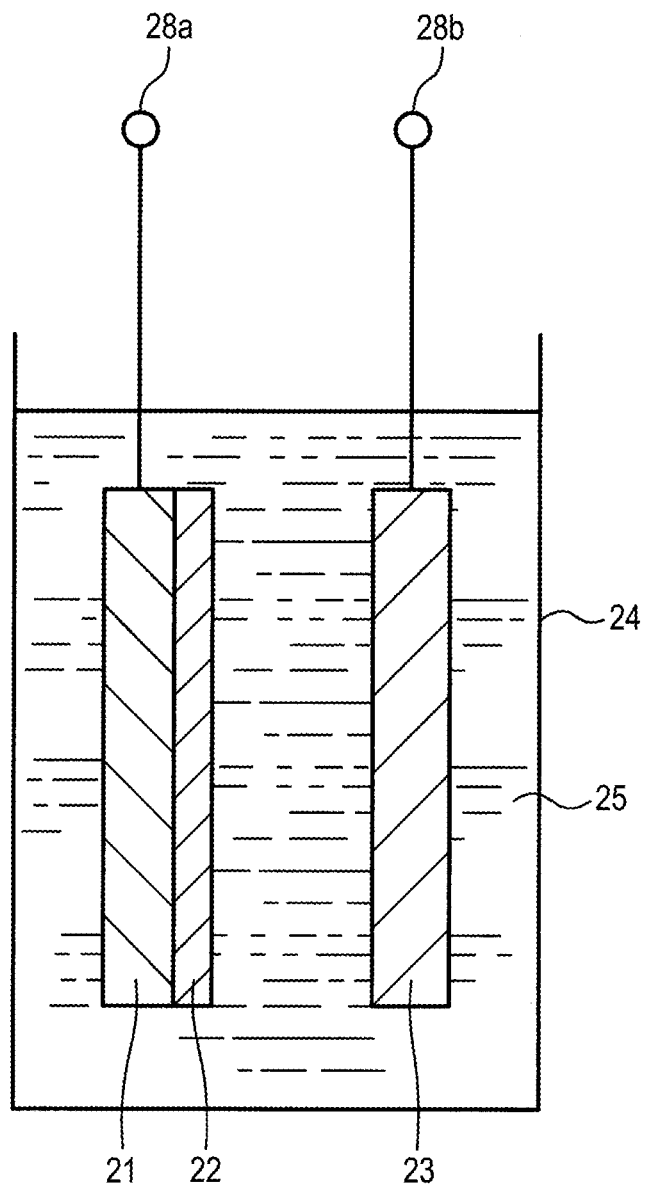
FIG. 33 is a schematic diagram representing a second exemplary usage of the protein photoelectric conversion device according to Second Embodiment of the present disclosure.

FIG. 33 represents a second exemplary usage of the protein photoelectric conversion device.

As illustrated in FIG. 33, in the second example, the natural electrode potential difference between the protein-immobilized electrode and the counter electrode 23 is used as the bias voltage, instead of generating a bias voltage using the bias power supply 26 as in the first example. In this case, the reference electrode 27 is not necessary. Specifically, the protein photoelectric conversion device represents a two-electrode system that makes use of the protein-immobilized electrode and the counter electrode 23. The second example does not differ from the first example except for this point.

Figure 34:
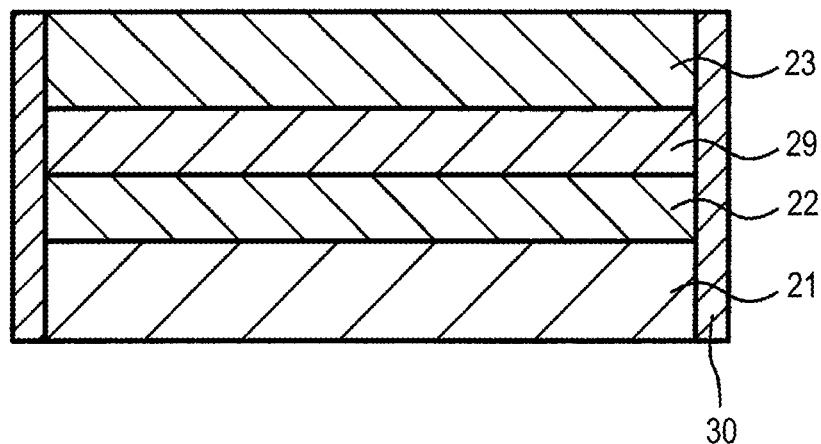
FIG. 34 is a schematic diagram representing a third exemplary usage of the protein photoelectric conversion device according to Second Embodiment of the present disclosure.

FIG. 34 represents a third exemplary usage of the protein photoelectric conversion device. In contrast to the protein photoelectric conversion devices of the first and second examples operated in a solution, the protein photoelectric conversion device of the third example can be operated in a dry environment.

As illustrated in FIG. 34, the protein photoelectric conversion device includes a solid electrolyte 29 between the protein-immobilized electrode and the counter electrode 23. Further, a sealing wall 30 is provided around the solid electrolyte 29, in order to prevent the solid electrolyte 29 from drying. The solid electrolyte 29 is selected from materials that do not lose the functions of the protein 22, specifically from materials such as agar and polyacrylamide gel that do not adsorb the protein. For the photoelectric conversion with the protein photoelectric conversion device, light is shone on the protein 22 of the protein-immobilized electrode by using the natural electrode potential difference between the protein-immobilized electrode and the counter electrode 23 as the bias voltage. The light is either a monochromatic component of the light that can photoexcite the protein 22, or light that has a component of such light. In this case, the magnitude and/or polarity of the photocurrent that flows inside the device can be varied by adjusting at least one of the natural electrode potential difference between the protein-immobilized electrode and the counter electrode 23, the intensity of the irradiation light, and the wavelength of the irradiation light. The third example does not differ from the first example except for these differences.

Protein Photoelectric Conversion Device Manufacturing Method

An example of the protein photoelectric conversion device manufacturing method is described below.

First, the electrode 21 is dipped in a solution that contains the protein 22 and a buffer, so as to immobilize the protein 22 on the electrode 21. As a result, the protein-immobilized electrode is formed.

Then, the protein-immobilized electrode and the counter electrode 23 are used to manufacture, for example, the protein photoelectric conversion device illustrated in FIG. 32, 33, or 34.

Operation of Protein Photoelectric Conversion Device

When the protein 22 of the protein photoelectric conversion device is zinc-substituted cytochrome $b_{562}$, shining blue monochromatic light of 418 to 420 nm wavelength or light including this wavelength component causes the protein 22 to generate electrons through photoexcitation, and the electrons move to the gold electrode 21 by electron transfer. When the protein 22 of the protein photoelectric conversion device is zinc chlorin cytochrome $b_{562}$, shining blue monochromatic light of 418 to 420 nm wavelength or red monochromatic light near 636 nm wavelength, or light including this wavelength component causes the protein 22 to generate electrons through photoexcitation, and the electrons move to the gold electrode 21 by electron transfer. The photocurrent is then extracted to outside from the gold electrode 21 and the counter electrode 23.

As described above, in Second Embodiment, the protein photoelectric conversion device for blue or red can be realized using the protein that includes cytochrome $b_{562}$ as the base.

The protein photoelectric conversion device can be used for, for example, optical sensors or imaging devices, and may be used with other devices such as a photocurrent amplifying circuit, as required. The optical sensor has various applications such as in detection of light signals, and is applicable to, for example, artificial retina.

The protein photoelectric conversion device can be used for various devices and equipment that make use of photoelectric conversion, specifically for, for example, electronic devices equipped with a photoreceptor. Basically, the electronic device may be of any type, including portable and stationary devices. Specific examples include digital cameras, and camera-integrated VCRs (video cassette recorders).

3. Third Embodiment

Liquid Contactless Whole Solid-Type Protein Photoelectric Conversion Device

Figure 35:
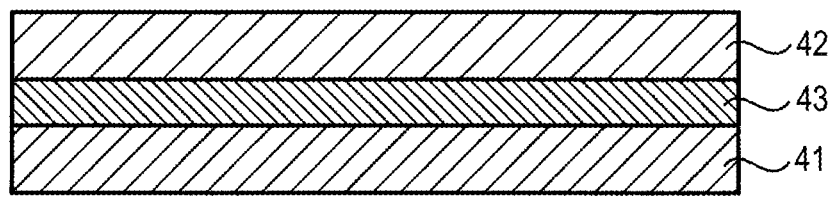
FIG. 35 is a cross sectional view illustrating a liquid contactless whole solid-type protein photoelectric conversion device according to Third Embodiment of the present disclosure.

FIG. 35 illustrates a liquid contactless whole solid-type protein photoelectric conversion device according to Third Embodiment. The liquid contactless whole solid-type protein photoelectric conversion device uses a solid protein layer. As used herein, "solid protein layer" means a layer solid as a collection of proteins, free of liquid such as water. Further, the term "liquid contactless" in the liquid contactless whole solid-type protein photoelectric conversion device means that the protein photoelectric conversion device is used not in contact with liquid such as water, both inside and outside. Further, the term "whole solid-type" in the liquid contactless whole solid-type protein photoelectric conversion device means that liquid such as water is not contained in any part of the device.

As illustrated in FIG. 35, the liquid contactless whole solid-type protein photoelectric conversion device is structured to include a solid protein layer 43 sandwiched between an electrode 41 and an electrode 42. The solid protein layer 43 is immobilized on the electrodes 41 and 42. Typically, the solid protein layer 43 is directly immobilized on the electrodes 41 and 42. However, an intermediate layer containing no water or any other liquid may be provided between the solid protein layer 43 and the electrodes 41 and 42, as required. The solid protein layer 43 does not contain liquid such as water. The solid protein layer 43 is formed of a protein monomolecular film or multimolecular film.

Figure 36:
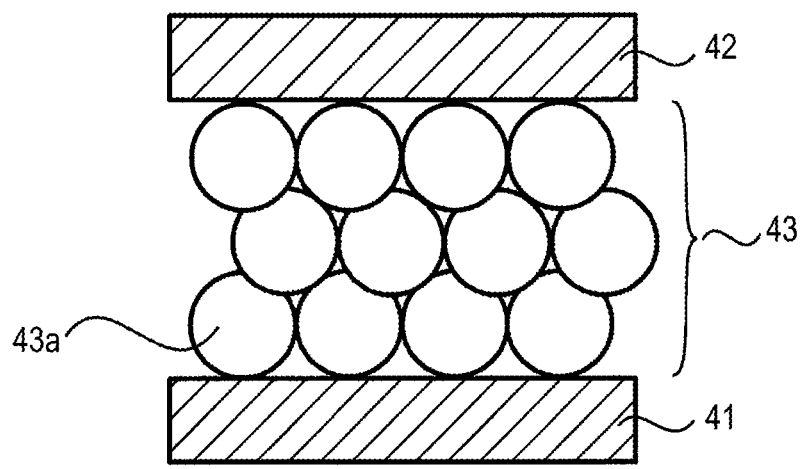
FIG. 36 is a cross sectional view magnifying the relevant portion of the liquid contactless whole solid-type protein photoelectric conversion device illustrated in FIG. 35.

FIG. 36 illustrates an exemplary structure of the solid protein layer 43 formed of a multimolecular film. As illustrated in FIG. 36, the solid protein layer 43 is formed as a laminate of n layers (where n is an integer of 2 or more) of monomolecular films formed as two-dimensional aggregates of proteins 43a of tin-substituted horse myocardial cytochrome c or tin-substituted cow myocardial cytochrome c. In FIG. 36, n=3.

A transparent electrode is used for at least one of the electrodes 41 and 42. In order to shine light on the solid protein layer 43 sandwiched between the electrodes 41 and 42, a transparent electrode is used for one of the electrodes 41 and 42 on the incident side of the light used to photoexcite the solid protein layer 43. Specifically, the transparent electrode may be configured from a transparent conductive material, for example, such as ITO, FTO, and NESA glass, that is transparent to the light used for the photoexcitation, or from an ultrathin metal film that allows for passage of the light. The other electrodes 41 or 42 may be configured from the transparent conductive material, or, when more efficient irradiation is desired, from non-transparent conductive material, for example, such as gold, copper, and aluminum.

Manufacturing Method of Liquid Contactless Whole Solid-Type Protein Photoelectric Conversion Device The manufacturing method of the liquid contactless whole solid-type protein photoelectric conversion device is described below.

First, a solution containing the proteins 43a, typically a protein solution dissolving the proteins 43a in a water-containing buffer is applied onto one of the electrodes 41 and 42, for example, the electrode 41, using methods such as a liquid dropping method, a spin coating method, a dipping method, spray method, and an inkjet method.

The protein solution applied to the electrode 41 is held at room temperature or lower temperatures to immobilize the proteins 43a in the protein solution on the electrode 41.

The proteins 43a in the protein solution immobilized on the electrode 41 are heated to dry within a range that does not denature the proteins 43a. This evaporates and removes all the liquid component of the protein solution.

As a result, only the proteins 43a are immobilized on the electrode 41, and the solid protein layer 43 is formed. The thickness of the solid protein layer 43 can easily be controlled by varying, for example, the amount of the protein solution applied to the electrode 41, or the concentration of the protein solution.

Thereafter, the electrode 42 is formed on the solid protein layer 43. The electrode 42 may be formed by depositing conductive material, using methods such as a sputtering method, a vacuum vapor deposition method, and an inkjet method.

This completes the manufacture of the liquid contactless whole solid-type protein photoelectric conversion device of interest.

Operation of Liquid Contactless Whole Solid-Type Protein Photoelectric Conversion Device The operation of the liquid contactless whole solid-type protein photoelectric conversion device is described below.

Figure 37:
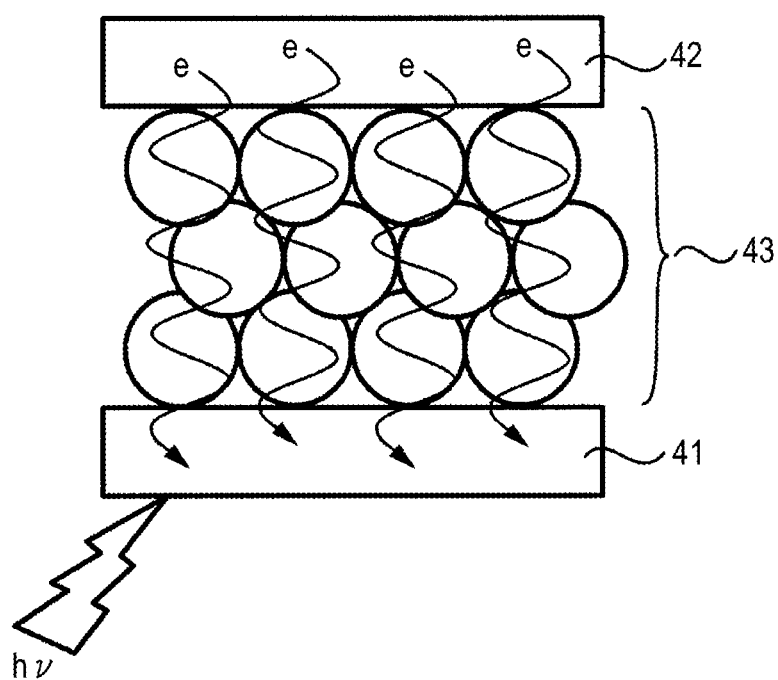
FIG. 37 is a schematic diagram explaining the operation of the liquid contactless whole solid-type protein photoelectric conversion device according to Third Embodiment of the present disclosure.

A voltage (bias voltage) is applied across the electrodes 41 and 42 of the liquid contactless whole solid-type protein photoelectric conversion device to make the electrode 42 the lower potential side. Here, the electrode 41 is the transparent electrode. The solid protein layer 43 is insulating when no light is shone on the solid protein layer 43 in the liquid contactless whole solid-type protein photoelectric conversion device, and accordingly no current flows between the electrodes 41 and 42. This represents the OFF state of the liquid contactless whole solid-type protein photoelectric conversion device. On the other hand, as illustrated in FIG. 37, the light (hv) incident on the solid protein layer 43 through the electrode 41 photoexcites the proteins 43a forming the solid protein layer 43, and as a result the solid protein layer 43 becomes conductive. Electrons (e) then flow towards the electrode 41 through the solid protein layer 43 from the electrode 42, producing a photocurrent flow between the electrodes 41, 42. This represents the ON state of the liquid contactless whole solid-type protein photoelectric conversion device. In this manner, the solid protein layer 43 behaves as a photoconductor, and enables the ON/OFF operation of the liquid contactless whole solid-type protein photoelectric conversion device in the presence or absence of incident light.

As described above, the solid protein layer 43 behaves as a photoconductor as a result of the electron transition between the molecular orbitals upon the photoexcitation of the electron transfer proteins 43a that form the solid protein layer 43, and the resulting movement of electrons or holes from one site to another of the electron transfer proteins 43a. The movement of the electrons or holes occurs in succession in the large numbers of electron transfer proteins 43a forming the solid protein layer 43, and a photocurrent flows between the electrodes 41 and 42.

The liquid contactless whole solid-type protein photoelectric conversion device according to Third Embodiment has various advantages, as follows. Specifically, because the liquid contactless whole solid-type protein photoelectric conversion device does not contain water inside the device and can operate not in contact with water, the photoelectric conversion device can be installed in electronic devices as a replacement for the semiconductor-based photoelectric conversion device of related art. Further, because no water is present inside the liquid contactless whole solid-type protein photoelectric conversion device, water-induced defects such as protein heat denature, radical damage, and decomposition can be prevented. The liquid contactless whole solid-type protein photoelectric conversion device is thus highly stable and excels in durability. Further, because no water is present inside and outside of the liquid contactless whole solid-type protein photoelectric conversion device, there is no fear of electrification, and strength can easily be ensured.

Further, in the liquid contactless whole solid-type protein photoelectric conversion device, the solid protein layer 43 is directly immobilized on the electrodes 41 and 42 without any mediators such as a linker molecule, and thus the resulting photocurrent is greater than that obtained when the solid protein layer 43 is immobilized via a liker molecule or other mediators. Further, in addition to being directly immobilized on the electrodes 41 and 42, the solid protein layer 43 can be formed as an ultrathin layer. This makes it possible to greatly reduce the distance between the electrodes 41 and 42, and enables the liquid contactless whole solid-type protein photoelectric conversion device to be formed as a thin device. Further, by forming the electrodes 41 and 42 as transparent electrodes, the liquid contactless whole solid-type protein photoelectric conversion device can be used by being laminated. Further, because the proteins 43a forming the solid protein layer 43 in the liquid contactless whole solid-type protein photoelectric conversion device have a very small size of about 2 nm, for example, the position of the incident light on the solid protein layer 43 can be very accurately detected. This makes it possible to realize high-resolution optical sensors and imaging devices.

Presumably, the photoconductive effect of the proteins 43a is due to the "one-photon multielectron generation". In the liquid protein photoelectric conversion device, however, the "one-photon multielectron generation" appears to be obstructed by the high resistance of the solution (solution resistance) present between the electrodes. On the other hand, the liquid contactless whole solid-type protein photoelectric conversion device does not involve such solution resistance, and thus enables "one-photon multielectron generation", making it possible to greatly improve photoelectric conversion efficiency and obtain a greater photocurrent.

The liquid contactless whole solid-type protein photoelectric conversion device can realize devices such as optical switching devices, optical sensors, and imaging devices. Because of the fast frequency response described above, the liquid contactless whole solid-type protein photoelectric conversion device can realize various devices, including high-speed switching optical switching devices, fast-responding optical sensors, and imaging devices capable of capturing an object moving at high speed. The liquid contactless whole solid-type protein photoelectric conversion device used in devices such as optical switching devices, optical sensors, and imaging devices can thus realize superior electronic devices.

4. Fourth Embodiment

Color Imaging Device

A color imaging device according to Fourth Embodiment uses protein photoelectric conversion devices for red, green, and blue light. These protein photoelectric conversion devices may be formed on the same substrate, or the protein photoelectric conversion devices for red, green, and blue light may be separately formed on different substrates, and these substrates may be arrayed to form the color imaging device.

Figure 38:
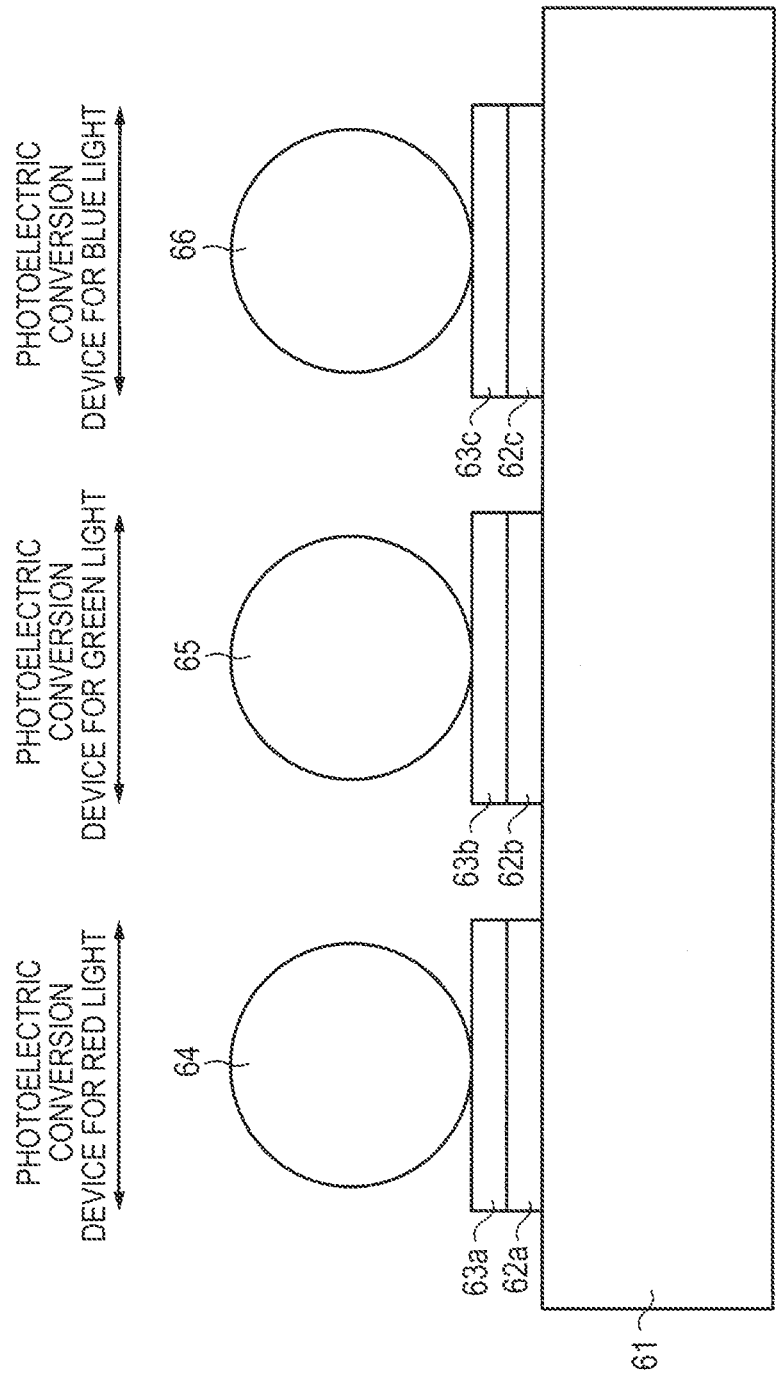
FIG. 38 is a schematic diagram representing a first example of a color imaging device according to Fourth Embodiment of the present disclosure.

FIG. 38 represents an example of the color imaging device, specifically a region in one of the pixels.

As illustrated in FIG. 38, the color imaging device includes gold electrodes 62a, 62b, and 62c in regions for forming the red, green, and blue protein photoelectric conversion devices, respectively, within a single pixel region on a substrate 61. The gold electrodes 62a, 62b, and 62c are electrically insulated from one another. The substrate 61 may be of any type, and may be selected according to needs. For example, semiconductor substrates such as silicon substrates, and transparent substrates such as glass substrates may be used. Specifically, when a semiconductor substrate such as a silicon substrate is used as the substrate 61, the signal processing circuit and the driving circuit of the color imaging device can easily be formed on the semiconductor substrate using the known semiconductor technology of related art. When a conductive substrate is used as the substrate 61, for example, an insulating film such as a $SiO_2$ film may be formed on the surface of the substrate 61, and the gold electrodes 62a, 62b, and 62c may be formed thereon.

The zinc chlorin cytochrome $b_{562}$ 64 that absorbs the red light is immobilized on the gold electrode 62a via a self-assembled monolayer 63a in the region of the red protein photoelectric conversion device. The modified zinc porphyrin cytochrome c552 65 that absorbs the green light is immobilized on the gold electrode 62b via a self-assembled monolayer 63b in the region of the green protein photoelectric conversion device (see JP-A-2010-190646). The zinc chlorin cytochrome $b_{562}$ 66 that absorbs the blue light is immobilized on the gold electrode 62c via a self-assembled monolayer 63c in the region of the blue protein photoelectric conversion device.

The red, green, and blue protein photoelectric conversion devices may be devices that use fluorescent protein, as follows. Specifically, as illustrated in FIG. 39, the cytochrome $b_{562}$ 67 is immobilized on the gold electrode 62a via the self-assembled monolayer 63a in the region of the red protein photoelectric conversion device, and a fluorescent protein 68 that absorbs the red light is electrostatically coupled to the cytochrome $b_{562}$ 67. The fluorescent protein 68 may be, for example, a commercially available fluorescent protein or a modified zinc porphyrin cytochrome c552. In the region of the green protein photoelectric conversion device, the cytochrome $b_{562}$ 69 is immobilized on the gold electrode 62b via the self-assembled monolayer 63b, and a fluorescent protein 70 that absorbs the green light is electrostatically coupled to the cytochrome $b_{562}$ 69. The fluorescent protein 70 may be, for example, a commercially available fluorescent protein or a modified zinc porphyrin cytochrome c552. In the region of the blue protein photoelectric conversion device, the cytochrome $b_{562}$ 71 is immobilized on the gold electrode 62c via the self-assembled monolayer 63c, and a fluorescent protein, for example, such as a zinc-substituted cytochrome c552 or a commercially available fluorescent protein, that absorbs the blue light is electrostatically coupled to the cytochrome $b_{562}$ 71.

The method used to dispose the red, green, and blue protein photoelectric conversion devices on the substrate 61 may be a known method used for devices such as CCD color imaging devices and MOS color imaging devices, and is selected according to needs.

Fourth Embodiment does not differ from First Embodiment except for these points.

A novel color imaging device using protein can be realized according to Fourth Embodiment.

The present disclosure has been specifically described with respect to certain embodiments and examples. However, the present disclosure is not limited to the foregoing embodiments and examples, and various modifications are possible based on the technical ideas of the present disclosure.

For example, details including the numerical values, structures, configurations, shapes, and materials described in the foregoing embodiments and examples are merely examples, and different numerical values, structures, configurations, shapes, and materials also may be used according to needs.

It should be understood by those skilled in the art that various modifications, combinations, sub-combinations and alterations may occur depending on design requirements and other factors insofar as they are within the scope of the appended claims or the equivalents thereof The invention is claimed as follows:

1. A protein photoelectric conversion device comprising:
a gold electrode; and
a substance selected from the group consisting of a zinc chlorin cytochrome $b_{562}$, a derivative thereof, and a variant thereof immobilized on the gold electrode.

2. The protein photoelectric conversion device according to claim 1, wherein the substance is immobilized in such an orientation that a porphyrin propionic acid contained therein faces the gold electrode.

3. The protein photoelectric conversion device according to claim 2, wherein a redox active group with $\pi$ electrons is introduced to the substance.

4. The protein photoelectric conversion device according to claim 3, wherein the redox active group is triptophan or quinone.

5. A photoelectric conversion system comprising:
a protein photoelectric conversion device that includes
a gold electrode; and
a substance selected from the group consisting of a zinc chlorin cytochrome $b_{562}$, a derivative thereof, and a variant thereof immobilized on the gold electrode.

6. The photoelectric conversion system according to claim 5, wherein the substance is immobilized in such an orientation that a porphyrin propionic acid contained therein faces the gold electrode.

7. The photoelectric conversion system according to claim 6, wherein a redox active group with $\pi$ electrons is introduced to the substance.

8. The photoelectric conversion system according to claim 7, wherein the redox active group is triptophan or quinone.

9. A protein-immobilized electrode comprising:
a gold electrode; and
a substance selected from the group consisting of a zinc chlorin cytochrome $b_{562}$, a derivative thereof, and a variant thereof immobilized on the gold electrode.

10. The protein-immobilized electrode according to claim 9, wherein the substance is immobilized in such an orientation that a porphyrin propionic acid contained therein faces the gold electrode.

11. The protein-immobilized electrode according to claim 10, wherein a redox active group with P electrons is introduced to the substance.

12. The protein-immobilized electrode according to claim 11, wherein the redox active group is triptophan or quinone.

* * * * *